United States Patent
Yoshioka et al.

(10) Patent No.: US 11,328,858 B2
(45) Date of Patent: May 10, 2022

(54) INDUCTOR COMPONENT AND INDUCTOR-COMPONENT INCORPORATING SUBSTRATE

(71) Applicant: Murata Manufacturing Co., Ltd., Kyoto-fu (JP)

(72) Inventors: Yoshimasa Yoshioka, Nagaokakyo (JP); Akinori Hamada, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 16/991,974

(22) Filed: Aug. 12, 2020

(65) Prior Publication Data

US 2020/0373079 A1    Nov. 26, 2020

Related U.S. Application Data

(62) Division of application No. 16/572,208, filed on Sep. 16, 2019, now Pat. No. 10,784,039, which is a
(Continued)

(30) Foreign Application Priority Data

Sep. 12, 2016  (JP) ................................. 2016-177627

(51) Int. Cl.
*H05K 1/11*     (2006.01)
*H05K 1/18*     (2006.01)
(Continued)

(52) U.S. Cl.
CPC ........... *H01F 27/327* (2013.01); *H01F 17/04* (2013.01); *H01F 27/2823* (2013.01);
(Continued)

(58) Field of Classification Search
CPC ... H05K 1/11; H05K 1/18; H05K 3/30; H01F 5/00; H01F 5/04; H01F 17/00;
(Continued)

(56) References Cited

U.S. PATENT DOCUMENTS 5,583,474 A  * 12/1996  Mizoguchi .......... H01F 17/0006
                                                              336/83
5,793,272 A  *  8/1998  Burghartz ........... H01F 17/0006
                                                              336/200
(Continued)

FOREIGN PATENT DOCUMENTS

CN         1217552 A      5/1999
JP      2004-319875 A    11/2004
(Continued)

OTHER PUBLICATIONS

An Office Action; "Notification of Reasons for Refusal," Mailed by the Japanese Patent Office dated Jan. 22, 2019, which corresponds to Japanese Patent Application No. 2016-177627 and is related to U.S. Appl. No. 15/682,976; with English language translation.

*Primary Examiner* — Xiaoliang Chen
(74) *Attorney, Agent, or Firm* — Studebaker & Brackett PC

(57) ABSTRACT

An inductor component including a spiral wiring wound into a planar shape. A first magnetic layer and a second magnetic layer are located at positions sandwiching the spiral wiring from both sides in a normal direction relative to the plane of the wound spiral wiring. A vertical wiring extending from the spiral wiring in the normal direction penetrates the inside of the first magnetic layer or the second magnetic layer.

20 Claims, 20 Drawing Sheets

Related U.S. Application Data division of application No. 15/682,976, filed on Aug. 22, 2017, now Pat. No. 10,453,602.

(51) Int. Cl.
| | |
|---|---|
| *H05K 3/30* | (2006.01) |
| *H01F 5/00* | (2006.01) |
| *H01F 5/04* | (2006.01) |
| *H01F 17/00* | (2006.01) |
| *H01F 27/24* | (2006.01) |
| *H01F 27/28* | (2006.01) |
| *H01F 27/32* | (2006.01) |
| *H01F 27/36* | (2006.01) |
| *H01F 27/255* | (2006.01) |
| *H01F 27/29* | (2006.01) |
| *H01F 17/04* | (2006.01) |

(52) U.S. Cl.
CPC ......... *H01F 27/2828* (2013.01); *H01F 27/29* (2013.01); *H01F 27/292* (2013.01); *H01F 27/323* (2013.01); *H05K 1/185* (2013.01); *H01F 2017/048* (2013.01); *H05K 1/113* (2013.01); *H05K 2201/086* (2013.01); *H05K 2201/09781* (2013.01); *H05K 2201/1003* (2013.01)

(58) Field of Classification Search
CPC .......... H01F 27/24; H01F 27/27; H01F 27/28; H01F 27/32; H01F 27/36; H01F 27/255
USPC .................. 174/260; 361/56, 707; 257/758, 257/E21.022, E23.114; 336/200, 220, 336/223
See application file for complete search history.

(56) References Cited

U.S. PATENT DOCUMENTS

| | | | | |
|---|---|---|---|---|
| 6,054,329 | A * | 4/2000 | Burghartz | H01F 17/0006 336/200 |
| 6,073,339 | A | 6/2000 | Levin | |
| 6,114,938 | A * | 9/2000 | Iida | H01F 17/0006 336/200 |
| 6,281,560 | B1 | 8/2001 | Allen et al. | |
| 6,377,155 | B1 | 4/2002 | Allen et al. | |
| 2002/0006013 | A1 * | 1/2002 | Sato | G11B 5/1278 360/123.09 |
| 2002/0008605 | A1 * | 1/2002 | Gardner | H01F 41/046 336/200 |
| 2002/0009577 | A1 | 1/2002 | Takaya et al. | |
| 2002/0060879 | A1 * | 5/2002 | Sato | G11B 5/313 360/123.38 |
| 2002/0063340 | A1 | 5/2002 | Sahara et al. | |
| 2003/0029830 | A1 | 2/2003 | Takaya et al. | |
| 2003/0030994 | A1 | 2/2003 | Takaya et al. | |
| 2003/0094944 | A1 * | 5/2003 | Suzuki | G01R 33/093 324/252 |
| 2003/0137384 | A1 * | 7/2003 | Itou | H05K 1/165 336/200 |
| 2004/0046630 | A1 * | 3/2004 | Gardner | H01F 41/042 336/200 |
| 2004/0238929 | A1 | 12/2004 | Anzai et al. | |
| 2005/0133924 | A1 * | 6/2005 | Crawford | H01L 23/5227 257/758 |
| 2005/0181684 | A1 * | 8/2005 | Ito | H05K 3/3442 439/894 |
| 2005/0184848 | A1 * | 8/2005 | Yoshida | H01F 17/0013 336/223 |
| 2005/0270745 | A1 * | 12/2005 | Chen | H01F 27/2804 361/707 |
| 2006/0001520 | A1 * | 1/2006 | Kaji | H01F 17/0006 336/223 |
| 2008/0303136 | A1 | 12/2008 | Mori et al. | |
| 2009/0072752 | A1 * | 3/2009 | Hente | H05B 45/60 315/241 R |
| 2009/0261920 | A1 | 10/2009 | Kawanami | |
| 2010/0052835 | A1 | 3/2010 | Lee et al. | |
| 2010/0259351 | A1 | 10/2010 | Bogert et al. | |
| 2010/0259352 | A1 | 10/2010 | Yan et al. | |
| 2010/0271161 | A1 * | 10/2010 | Yan | H01F 1/26 336/83 |
| 2010/0314455 | A1 | 12/2010 | Kato et al. | |
| 2011/0291790 | A1 * | 12/2011 | Okumura | H01F 17/0013 336/200 |
| 2011/0316658 | A1 * | 12/2011 | Liu | H01F 17/0013 336/200 |
| 2012/0032298 | A1 | 2/2012 | Miyagawa et al. | |
| 2012/0112869 | A1 * | 5/2012 | Nishikawa | H01F 17/0013 336/200 |
| 2012/0133472 | A1 * | 5/2012 | Nishikawa | H01F 17/04 336/200 |
| 2013/0015935 | A1 | 1/2013 | Chang et al. | |
| 2013/0057379 | A1 * | 3/2013 | Klein | H01F 17/0033 336/200 |
| 2013/0076456 | A1 | 3/2013 | Chang et al. | |
| 2013/0082813 | A1 * | 4/2013 | Wi | H01F 5/003 336/200 |
| 2013/0141205 | A1 * | 6/2013 | Lee | H01F 5/003 336/200 |
| 2013/0147592 | A1 * | 6/2013 | Yoo | H01F 41/041 336/200 |
| 2013/0222101 | A1 * | 8/2013 | Ito | H01F 5/003 336/83 |
| 2014/0009254 | A1 * | 1/2014 | Ohkubo | H01F 27/29 336/192 |
| 2014/0176286 | A1 | 6/2014 | Okada et al. | |
| 2015/0029623 | A1 * | 1/2015 | Yang | H02H 9/045 361/56 |
| 2015/0145618 | A1 | 5/2015 | Oho et al. | |
| 2015/0357115 | A1 * | 12/2015 | Ohkubo | H01F 17/0033 336/192 |
| 2016/0049234 | A1 | 2/2016 | Kawashima et al. | |
| 2016/0093434 | A1 | 3/2016 | Hamada | |
| 2016/0099098 | A1 * | 4/2016 | Yamaguchi | H01F 17/0006 336/221 |
| 2016/0189852 | A1 * | 6/2016 | Jeon | H01F 27/292 336/192 |
| 2016/0211071 | A1 * | 7/2016 | Jeong | H01F 27/36 |
| 2016/0217903 | A1 * | 7/2016 | Jeong | H01F 17/0013 |
| 2016/0217908 | A1 * | 7/2016 | Jeong | H01F 17/0013 |
| 2016/0217911 | A1 * | 7/2016 | Mano | H01F 27/2804 |
| 2016/0217917 | A1 * | 7/2016 | Jeong | H01F 27/292 |
| 2016/0314892 | A1 * | 10/2016 | Fukushima | H01F 17/0013 |
| 2016/0379746 | A1 * | 12/2016 | Yoshioka | H01F 27/38 336/220 |
| 2016/0379750 | A1 | 12/2016 | Hamada et al. | |
| 2017/0032882 | A1 | 2/2017 | Yang et al. | |
| 2017/0032887 | A1 * | 2/2017 | Hamada | H01F 27/292 |
| 2017/0098997 | A1 | 4/2017 | Hamada et al. | |
| 2017/0111995 | A1 | 4/2017 | Nishikawa et al. | |
| 2017/0148561 | A1 * | 5/2017 | Yoon | H01F 27/022 |
| 2017/0169930 | A1 | 6/2017 | Kudo et al. | |
| 2017/0196091 | A1 * | 7/2017 | Lee | H01F 27/2804 |
| 2017/0207020 | A1 | 7/2017 | Hamada et al. | |
| 2017/0236633 | A1 | 8/2017 | Park et al. | |
| 2017/0256353 | A1 | 9/2017 | Park et al. | |

FOREIGN PATENT DOCUMENTS

| | | |
|---|---|---|
| JP | 2014-197590 A | 10/2014 |
| JP | 2015-088753 A | 5/2015 |
| JP | 2017-069523 A | 4/2017 |
| WO | 2011/145490 A1 | 11/2011 |

* cited by examiner

INDUCTOR COMPONENT AND INDUCTOR-COMPONENT INCORPORATING SUBSTRATE

CROSS REFERENCE TO RELATED APPLICATIONS

This application is a Divisional of U.S. patent application Ser. No. 16/572,208 filed Sep. 16, 2019, which is a Divisional of U.S. patent application Ser. No. 15/682,976 filed Aug. 22, 2017, which claims benefit of priority to Japanese Patent Application 2016-177627 filed Sep. 12, 2016, the entire content of which is incorporated herein by reference.

BACKGROUND

A conventional inductor-component incorporating substrate is described in Japanese Laid-Open Patent Publication No. 2004-319875. This inductor-component incorporating substrate includes an inductor component having a winding structure and a substrate in which the inductor component is embedded. The coil diameter of the winding of the inductor component is parallel to the thickness direction of the substrate.

Japanese Laid-Open Patent Publication No. 2014-197590 describes an inductor component including a spiral wiring wound into a planar shape along with a first magnetic layer and a second magnetic layer located at positions sandwiching the spiral wiring from both sides in a normal direction of the plane of the wound spiral wiring. The outer shape of this inductor component is a rectangular parallelepiped, and has an upper surface and a lower surface perpendicular to the normal direction and four side surfaces parallel to the normal direction. The inductor is a surface-mount type chip component, and the spiral wiring is connected to an external electrode via a lead-out part (terminal electrode+lead-out electrode) connected to an outer circumferential end thereof. The lead-out part and the external electrode are exposed from the side surface and the upper surface, respectively, to the outside, constituting an L-shaped external terminal.

SUMMARY

Problem to be Solved by the Disclosure

As inductor components are reduced in size/height, studies are being conducted not only on conventional surface mounting but also on three-dimensional mounting of inductor components through application of a SiP (System in Package) technique, a PoP (Package on Package) technique, etc. For example, by embedding an inductor component in a substrate, a whole system can be made smaller/thinner. However, since the inductor incorporating substrate of Japanese Laid-Open Patent Publication No. 2004-319875 has the inductor component with a winding structure and the coil diameter of the winding parallel to the thickness direction of the substrate, it is difficult to maintain the characteristics of the inductor component when the substrate is thinned.

Therefore, it is conceivable that the inductor component of Japanese Laid-Open Patent Publication No. 2014-197590 is embedded in a substrate with the plane of the wound spiral wiring made orthogonal to the thickness direction of the substrate. This can reduce the influence of thinning of the substrate on the characteristics of the inductor component.

On the other hand, the inductor component of Japanese Laid-Open Patent Publication No. 2014-197590 is supposed to be surface mounted and it can hardly be said that the configuration is adapted to three-dimensional mounting. For example, the inductor component of Japanese Laid-Open Patent Publication No. 2014-197590 has the spiral wiring once led out by the lead-out part toward the side surface of the inductor component (in the direction along the plane of the wound spiral wiring=the direction of a principal surface of the substrate) before being connected to the external terminal. This is based on the assumption that in the surface mounting, a wiring pattern of the substrate is connected from the side surface side to the inductor component along the principal surface of the substrate. On the other hand, in the three-dimensional mounting, the wiring pattern of the substrate is connected from the upper surface side or the lower surface side to the inductor component and, if the spiral wiring is once led out toward the side surface as in the inductor component of Japanese Laid-Open Patent Publication No. 2014-197590, the wiring pattern once makes a detour toward the side surface of the inductor component before being connected to the spiral wiring, resulting in unnecessary routing of wiring.

Additionally, in the surface-mount type inductor components including not only those having L-shaped external terminals as in the inductor component of Japanese Laid-Open Patent Publication No. 2014-197590 but also bottom-electrode type inductor components having external terminals exposed only from the upper surface or the lower surface, the external terminals are basically arranged close to the side surfaces. This is because the inductor component is soldered to the substrate in the case of the surface mounting and the intervals between the external terminals are therefore made as wide as possible so as to prevent a short circuit between electrodes from occurring due to wetting and spreading of solder. On the other hand, in the case of the three-dimensional mounting, the connection between the inductor component and the wiring pattern of the substrate is not limited to the soldering. Thus, the wide intervals between the external terminals may lead to unnecessary routing of wiring.

Therefore, a problem to be solved by the present disclosure is to provide an inductor component adaptable to the three-dimensional mounting and capable of improving a degree of freedom in circuit design, and an inductor-component incorporating substrate including the inductor.

Solutions to the Problems

To solve the problem, an aspect of the present disclosure provides an inductor component comprising a spiral wiring wound into a planar shape;

a first magnetic layer and a second magnetic layer located at positions sandwiching the spiral wiring from both sides in a normal direction relative to the plane of the wound spiral wiring; and a vertical wiring extending from the spiral wiring in the normal direction to penetrate the inside of the first magnetic layer or the second magnetic layer.

In an embodiment of the inductor component, the inductor component further comprises an insulating layer disposed between the first magnetic layer and the second magnetic layer and having the spiral wiring embedded therein, and the vertical wiring includes a via conductor extending from the spiral wiring in the normal direction to penetrate the inside of the insulating layer and a columnar wiring extending from the via conductor in the normal direction to penetrate the inside of the first magnetic layer or the second magnetic layer.

"Penetrating the inside" refers to a state in which a penetrating body (the vertical wiring, the columnar wiring, the via conductor) is surrounded by a penetrated object (the magnetic layer, the insulating layer) when viewed in an extending direction (the normal direction), and does not include a state in which a side surface of the penetrating body is exposed from the penetrated object when viewed in the extending direction.

The inductor component is adaptable to three-dimensional mounting and capable of improving a degree of freedom in circuit design.

In an embodiment of the inductor component, the vertical wiring is located on each of both sides in the normal direction sandwiching the spiral wiring.

According to the embodiment, a degree of freedom in circuit design can further be improved.

In an embodiment of the inductor component, the spiral wiring includes a connecting portion connected to the vertical wiring, and the vertical wiring on the side of the first magnetic layer and the vertical wiring on the side of the second magnetic layer are connected to a common connecting portion of the spiral wiring.

According to the embodiment, a degree of freedom in circuit design can be improved.

In an embodiment of the inductor component, the inductor component further comprises a conductive dummy terminal disposed on a surface of the first magnetic layer or the second magnetic layer without being electrically connected to the spiral wiring.

According to the embodiment, heat dissipation is improved and the highly reliable inductor component can be provided. If being grounded, the dummy terminal can suppress propagation of static electricity to an external circuit and can prevent malfunction etc. due to noise. When the inductor component is surface-mounted, the dummy terminal can be used for stabilizing the posture of the inductor component.

In an embodiment of the inductor component, an end surface of the vertical wiring exposed from the surface of the first magnetic layer or the second magnetic layer is not subjected to a rust prevention treatment.

According to the embodiment, thinning can be achieved in such a case that the inductor component is embedded in a substrate.

In an embodiment of the inductor component, the inductor component further comprises an external terminal covering the end surface of the vertical wiring exposed from the surface of the first magnetic layer or the second magnetic layer, and when viewed in the normal direction, the area of the external terminal is larger than the area of the vertical wiring.

According to the embodiment, the inductor component is improved in mounting reliability. When the inductor component is embedded in the mounting substrate, a yield can be improved.

In an embodiment of the inductor component, a surface of the external terminal is located on the outer side in the normal direction more than the surface of the first magnetic layer or the second magnetic layer.

According to the embodiment, for example, when the inductor component is embedded in the substrate, the manufacturing efficiency of the substrate can be improved.

In an embodiment of the inductor component, the external terminal is located on each of both sides in the normal direction sandwiching the spiral wiring.

According to the embodiment, a degree of freedom in circuit design can be improved.

In an embodiment of the inductor component, the inductor component further comprises a coating film covering the surface of the first magnetic layer or the second magnetic layer and exposing at least a portion of the end surface of the vertical wiring.

According to the embodiment, the reliability of the inductor component and a degree of freedom in arrangement of external terminals can be increased.

In an embodiment of the inductor component, the end surface of the vertical wiring exposed from the coating film is at a position displaced with respect to a contact surface between the vertical wiring and the spiral wiring when viewed in the normal direction.

According to the embodiment, a degree of freedom in arrangement of external terminals is improved.

In an embodiment of the inductor component, the thickness of the first magnetic layer is different from the thickness of the second magnetic layer.

According to the embodiment, a degree of freedom in circuit design can be increased.

In an embodiment of the inductor component, the vertical wiring penetrates the inside of the thicker one between the first magnetic layer and the second magnetic layer.

According to the embodiment, noise propagation to an external circuit can be suppressed.

In an embodiment of the inductor component, the inductor component further comprises a dummy terminal disposed on the surface of the first magnetic layer or the second magnetic layer without being electrically connected to the spiral wiring, and the dummy terminal is disposed on the surface of the thinner one between the first magnetic layer and the second magnetic layer.

According to the embodiment, the heat dissipation effect can be improved.

In an embodiment of the inductor component, the spiral wiring is one of a plurality of spiral wirings, and the inductor component further comprises a second via conductor connecting the plurality of spiral wirings in series.

According to the embodiment, the inductance value can be improved.

In an embodiment of the inductor component, the spiral wiring includes a first spiral wiring and a second spiral wiring, and the first spiral wiring and the second spiral wiring are electrically connected to the common vertical wiring.

According to the embodiment, an amount of wiring routing can be reduced.

In an embodiment of the inductor component, the first spiral wiring and the second spiral wiring are laminated in the normal direction.

According to the embodiment, the inductor component can be reduced in size.

An aspect of the present disclosure provides an inductor-component incorporating substrate comprising the inductor component;

a substrate in which the inductor component is embedded; and a substrate wiring including a pattern part extending in a direction along a principal surface of the substrate and a via part extending in a thickness direction of the substrate, the substrate wiring being connected at the via part to the inductor component.

According to the inductor-component incorporating substrate, a degree of freedom in circuit design can be improved.

In an embodiment of the inductor-component incorporating substrate, the via part includes a first via part connected to the inductor component from one side in the normal direction and a second via part connected to the inductor component from the other side in the normal direction.

According to the embodiment, a degree of freedom in circuit design can be improved.

In an embodiment of the inductor-component incorporating substrate, the spiral wiring includes a connecting portion connected to the vertical wiring, and the first via part and the second via part are electrically connected to the common connecting portion of the spiral wiring.

According to the embodiment, a degree of freedom in circuit design can be improved.

In an embodiment of the inductor-component incorporating substrate, the inductor component has a dummy terminal disposed on the surface of the first magnetic layer or the second magnetic layer without being electrically connected to the spiral wiring, and the dummy terminal is connected to the substrate wiring.

According to the embodiment, heat dissipation is improved.

In an embodiment of the inductor-component incorporating substrate, the dummy terminal is connected to a ground line of the substrate wiring.

According to the embodiment, propagation of static electricity to an external circuit can be suppressed and malfunction etc. due to noise can be prevented.

Effect of the Disclosure

According to the inductor component and the inductor-component incorporating substrate of an aspect of the present disclosure, a degree of freedom in circuit design can be improved.

DETAILED DESCRIPTION

An aspect of the present disclosure will now be described in detail with reference to shown embodiments.

First Embodiment (Configuration)

Figure 1:
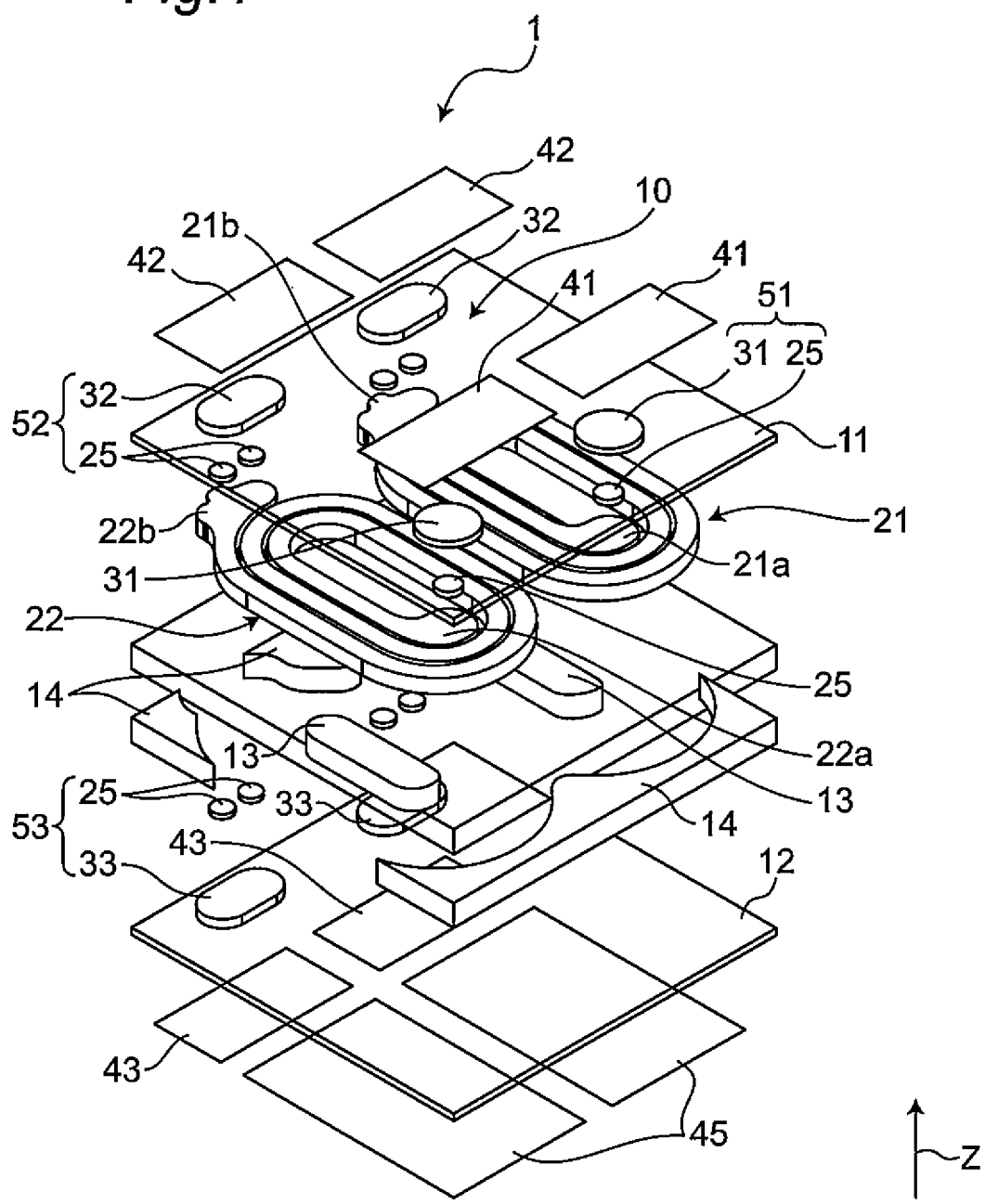
FIG. 1 is an exploded transparent perspective view of an inductor component according to a first embodiment.
Figure 2:
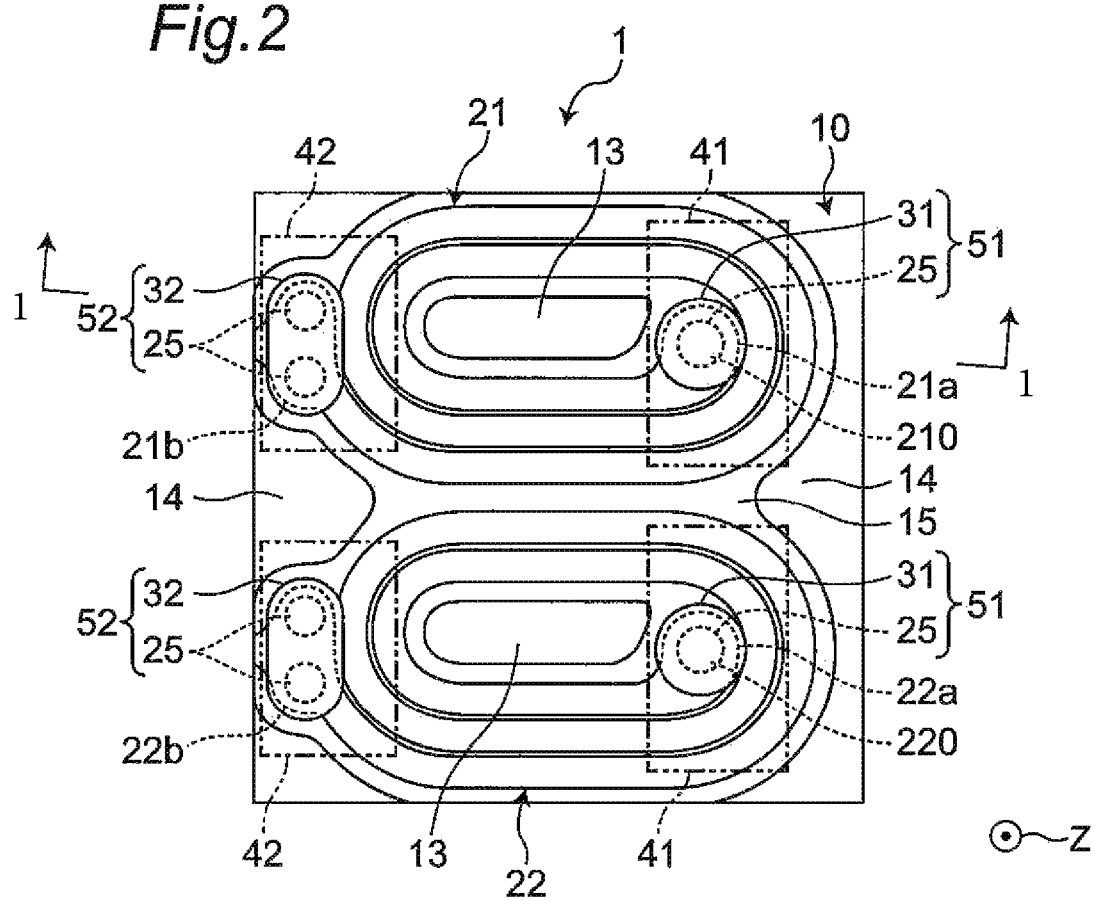
FIG. 2 is a plane view of the inductor component according to the first embodiment.
Figure 3:
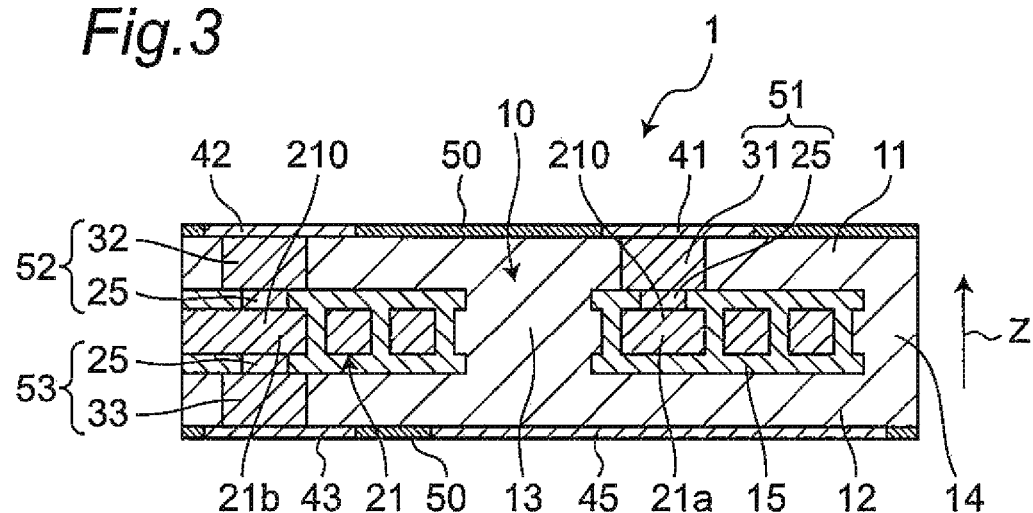
FIG. 3 is a cross-sectional view of the inductor component according to the first embodiment.

FIG. 1 is an exploded transparent perspective view of a first embodiment of an inductor component. FIG. 2 is a perspective plane view of the inductor component. FIG. 3 is a cross-sectional view taken along 1-1 of FIG. 2.

An inductor component 1 is mounted on an electronic device such as a personal computer, a DVD player, a digital camera, a TV, a portable telephone, and automotive electronics, for example, and is a component generally having a rectangular parallelepiped shape, for example. However, the shape of the inductor component 1 is not particularly limited and may be a circular columnar shape, a polygonal columnar shape, a truncated cone shape, or a truncated polygonal pyramid shape.

As shown in FIGS. 1 to 3, the inductor component 1 has a magnetic layer 10, an insulating layer 15, spiral wirings 21, 22, vertical wirings 51 to 53, external terminals 41 to 43, dummy terminals 45, and a coating film 50.

The first spiral wiring 21 is made of a conductive material and wound into a planar shape. A normal direction relative to the plane of the wound first spiral wiring 21 is defined as a Z direction (up-down direction) in the figures and it is assumed in the following description that a forward Z direction faces toward the upper side while a reverse Z direction faces toward the lower side. The definition of the Z direction is the same in other embodiments and examples. The first spiral wiring 21 is spirally wound in a clockwise direction from an inner circumferential end 21a toward an outer circumferential end 21b when viewed from the upper side. The second spiral wiring 22 has the same configuration as the first spiral wiring 21 and is spirally wound in the clockwise direction from an inner circumferential end 22a toward an outer circumferential end 22b. The first spiral wiring 21 and the second spiral wiring 22 are arranged in parallel on the same plane.

The magnetic layer 10 is made of a magnetic material and is made up of a first magnetic layer 11, a second magnetic layer 12, inner magnetic path parts 13, and outer magnetic path parts 14. The first magnetic layer 11 and the second magnetic layer 12 are located at positions sandwiching the spiral wirings 21, 22 from both sides in the Z direction (the normal direction relative to the plane of the wound spiral wirings 21, 22). Specifically, the first magnetic layer 11 is located on the upper side of the spiral wirings 21, 22, and the second magnetic layer 12 is located on the lower side of the spiral wirings 21, 22. The inner magnetic path parts 13 and the outer magnetic path parts 14 are arranged on the inside and outside, respectively, of the spiral wirings 21, 22 as shown in FIG. 2 and are connected to the first magnetic layer 11 and the second magnetic layer 12 as shown in FIG. 3. In this way, the magnetic layer 10 constitutes a closed magnetic path with respect to the spiral wirings 21, 22. It is noted that although depicted in a distinguished manner in the figures, the first magnetic layer 11, the second magnetic layer 12, the inner magnetic path parts 13, and the outer magnetic path parts 14 may be integrated as the magnetic layer 10.

The insulating layer 15 is made of an insulating material and is disposed between the first magnetic layer 11 and the second magnetic layer 12 with the first spiral wiring 21 and the second spiral wiring 22 embedded in the insulating layer 15. Although FIG. 1 is the figure showing the magnetic layer 10 and the insulating layer 15 made transparent, the magnetic layer 10 and the insulating layer 15 may be transparent, translucent, or opaque, or may be colored.

The vertical wirings 51 to 53 are made of a conductive material and extend from the spiral wirings 21, 22 in the Z direction to penetrate the inside of the first magnetic layer 11 or the second magnetic layer 12. The vertical wirings 51 to 53 include via conductors 25 extending from the spiral wirings 21, 22 in the Z direction to penetrate the inside of the insulating layer 15 and columnar wirings 31 to 33 extending from the via conductors 25 in the Z direction to penetrate the inside of the first magnetic layer 11 or the second magnetic layer 12.

The first vertical wiring 51 includes the via conductor 25 extending upward from an upper surface of the inner circumferential end 21a of the first spiral wiring 21, and the first columnar wiring 31 extending upward from the via conductor 25 to penetrate the inside of the first magnetic layer 11. The second vertical wiring 52 and the third vertical wiring 53 are present on each of both sides in the Z direction sandwiching the first spiral wiring 21. The second vertical wiring 52 includes the via conductor 25 extending upward from an upper surface of the outer circumferential end 21b of the first spiral wiring 21, and the second columnar wiring 32 extending upward from the via conductor 25 to penetrate the inside of the first magnetic layer 11. The third vertical wiring 53 includes the via conductor 25 extending downward from a lower surface of the outer circumferential end 21b of the first spiral wiring 21, and the third columnar wiring 33 extending downward from the via conductor 25 to penetrate the inside of the second magnetic layer 12. The same applies to the vertical wirings 51 to 53 on the side of the second spiral wiring 22.

The external terminals 41 to 43 are made of a conductive material and cover the end surfaces of the vertical wirings 51 to 53 exposed from the surface of the first magnetic layer 11 or the second magnetic layer 12. The "surface" is a surface facing toward the outside of the inductor component 1, and the surface of the first magnetic layer 11 is the upper surface while the surface of the second magnetic layer 12 is the lower surface. The first external terminal 41 is disposed on the upper surface of the first magnetic layer 11 and covers the end surface of the vertical wiring 51 (the first columnar wiring 31) exposed from the upper surface. The second external terminal 42 and the third external terminal 43 are present on each of both sides in the Z direction sandwiching the first spiral wiring 21. The second external terminal 42 is disposed on the upper surface of the first magnetic layer 11 and covers the end surface of the vertical wiring 52 (the second columnar wiring 32) exposed from the upper surface. The third external terminal 43 is disposed on the lower surface of the second magnetic layer 12 and covers the end surface of the vertical wiring 53 (the third columnar wiring 33) exposed from the lower surface. The same applies to the external terminals 41 to 43 on the side of the second spiral wiring 22.

The dummy terminals 45 are made of a conductive material and disposed as two terminals on the lower surface of the second magnetic layer 12. The dummy terminals 45 are not electrically connected to the first spiral wiring 21 and the second spiral wiring 22. One of the dummy terminals 45 is disposed on the lower surface of the second magnetic layer 12 to overlap with the lower side of the first spiral wiring 21. The other dummy terminal 45 is disposed on the lower surface of the second magnetic layer 12 to overlap with the lower side of the second spiral wiring 22.

Preferably, a rust prevention treatment is applied to at least one of the external terminals 41 to 43 and the dummy terminals 45. This rust prevention treatment refers to coating with Ni and Au or Ni and Sn etc. This enables the suppression of copper leaching due to solder and the rusting so that the inductor component 1 with high mounting reliability can be provided.

The coating film 50 is made of an insulating material and, as shown in FIG. 3, covers the upper surface of the first magnetic layer 11 and the lower surface of the second magnetic layer 12 while exposing the end surfaces of the vertical wirings 51 to 53, the external terminals 41 to 43, and the dummy terminals 45. In FIGS. 1 and 2, the coating film 50 is not shown.

According to the inductor component 1, the vertical wirings 51 to 53 extend from the spiral wirings 21, 22 in the Z direction to penetrate the inside of the first magnetic layer 11 or the second magnetic layer 12. More specifically, the vertical wirings 51 to 53 include the via conductors 25 extending from the spiral wirings 21, 22 in the Z direction to penetrate the inside of the insulating layer 15, and the columnar wirings 31 to 33 extending from the via conductors 25 in the Z direction to penetrate the inside of the first magnetic layer 11 or the second magnetic layer 12.

Therefore, the inductor component 1 has wirings directly led out from the spiral wirings 21, 22 in the Z direction. This means that the spiral wirings 21, 22 are led out through the shortest distance to the upper surface side or the lower surface side of the inductor component, and means that unnecessary routing of wiring can be reduced in three-dimensional mounting in which a substrate wiring is connected from the upper surface side or the lower surface side of the inductor component 1. Therefore, the inductor component 1 has a configuration sufficiently adaptable to the three-dimensional mounting and can improve a degree of freedom in circuit design.

Additionally, the inductor component 1 has no wiring led out in a direction toward a side surface from the spiral wirings 21, 22 and therefore can achieve a reduction in the area of the inductor component 1 viewed in the Z direction, i.e., in the mounting area. Thus, the inductor component 1 can achieve a reduction in the mounting area required for both the surface mounting and the three-dimensional mounting, and can improve the degree of freedom in circuit design.

Additionally, the inductor component 1 has the columnar wirings 31 to 33 penetrating the inside of the magnetic layer 10 and extending in the normal direction relative to the plane of the wound spiral wirings 21, 22. In this case, a current flows through the columnar wirings 31 to 33 in the Z direction rather than the direction along the plane of the wound spiral wirings 21, 22.

When the inductor component 1 is reduced in size, the magnetic layer 10 becomes relatively smaller and, particularly, the inner magnetic path part 13 is increased in magnetic flux density and more easily reaches the magnetic saturation. However, the magnetic flux caused by the Z-direction current flowing through the columnar wirings 31 to 33 does not pass through the inner magnetic path part 13, so that the influence on magnetic saturation characteristic, i.e., DC superimposition characteristics, can be reduced. In contrast, when a wiring is led out by a lead-out part from a spiral wiring toward a side surface (the side in the direction along the plane of the wound spiral wiring) as in conventional techniques, a portion of the magnetic flux generated by the current flowing through the lead-out part must pass through the inner magnetic path part and the outer magnetic path part, so that the magnetic saturation characteristics or DC superimposition characteristics are inevitably affected.

Since the columnar wirings 31 to 33 penetrate the inside of the first magnetic layer 11 or the second magnetic layer 12, opening portions of the magnetic layer 10 can be made small when the wirings are led out from the spiral wirings 21, 22, and the closed magnetic path structure can easily be achieved. As a result, noise propagation toward the substrate can be suppressed.

Furthermore, since the inductor component 1 has the vertical wirings 51 to 53 respectively located on both sides in the Z direction sandwiching the spiral wirings 21, 22, the wirings can respectively be led out on both sides in the Z direction sandwiching the spiral wirings 21, 22. Specifically, for example, the inductor component 1 has the external terminals 41 to 43 respectively located on both sides in the Z direction sandwiching the spiral wirings 21, 22. This is preferable for, for example, the three-dimensional mounting in which a substrate wiring can be connected from the upper and lower surface sides of the inductor component 1, because more options are available in a method of connecting the substrate wiring.

The external terminals 41 to 43 are not essential constituent elements of the inductor component 1 and, for example, the substrate wirings may directly be connected to the end surfaces of the vertical wirings 51 to 53 (the columnar wirings 31 to 33) exposed from the surface of the first magnetic layer 11 or the second magnetic layer 12 (the coating film 50). In this case, the end surfaces of the vertical wirings 51 to 53 exposed from the surface of the first magnetic layer 11 or the second magnetic layer 12 may not be subjected to the rust prevention treatment. If the inductor component 1 is embedded in the substrate without exposing the inductor component 1 to the outside air, the connection reliability does not deteriorate even without applying the rust prevention treatment, and the inductor component 1 can further be reduced in height by the coating of the rust prevention treatment. The vertical wirings 51 to 53 and the external terminals 41 to 43 may be formed only on one side (the upper side or the lower side) in the Z direction from the spiral wirings 21, 22.

Furthermore, since the spiral wirings 21, 22 are wound into a planar shape along the magnetic layer 10, the large inner magnetic path parts 13 can be ensured regardless of thinning, so that the thin inductor component 1 having high magnetic saturation characteristics can be provided. In contrast, if an inductor component having a coil diameter of a winding parallel to the thickness direction of the substrate is used as in the conventional case, the coil diameter=the area of the magnetic layer decreases due to further thinning of the inductor component, i.e., the thinning in the thickness direction of the substrate. As a result, the magnetic saturation characteristics deteriorate, making it impossible to sufficiently energize the inductor. Moreover, since the inductor is formed of the winding with limited wire diameter, it is difficult to achieve miniaturization/thinning while giving consideration to substrate embedding etc. in the first place. Additionally, since a portion of the winding is used as an external terminal and electrically connected to a mounting substrate by soldering, the thinning is hindered by the thickness of solder. It is also difficult to form an inductor array for supporting multiphase power supply.

Furthermore, the inductor component 1 includes the conductive dummy terminals 45 disposed on the surface of the first magnetic layer 11 or the second magnetic layer 12 without being electrically connected to the spiral wirings 21, 22. Since the dummy terminals 45 are conductive and therefore have a high thermal conductivity, an improvement in heat dissipation enables the provision of the highly reliable (highly environmentally-resistant) inductor component 1. For example, if the dummy terminals 45 are connected to a substrate wiring of a substrate (including an embedded type substrate), a heat dissipation path is formed from the dummy terminals 45 through the substrate wiring, resulting in a further improvement in heat dissipation.

If the dummy terminals 45 are grounded, for example, if the dummy terminals 45 are connected to a ground line of the substrate wiring, the dummy terminals 45 can form an electrostatic shield to suppress propagation of static electricity to an external circuit and can prevent malfunction etc. due to noise.

When the inductor component 1 is surface-mounted, the dummy terminals 45 can be used for stabilizing the posture of the inductor component 1.

Furthermore, as shown in FIG. 3, the inductor component 1 includes the coating film 50 covering the surface of the first magnetic layer 11 or the second magnetic layer 12 while exposing the end surfaces of the vertical wirings 51 to 53. It is noted that the "exposing" includes not only exposing to the outside of the inductor component 1 but also exposing to another member.

More specifically, on the upper surface of the first magnetic layer 11, the coating film 50 covers a region excluding the external terminals 41, 42. On the lower surface of the second magnetic layer 12, the coating film 50 covers a region excluding the external terminals 43 and the dummy terminals 45. In this way, the end surfaces of the vertical wirings 51 to 53 connected to the external terminals 41 to 43 are exposed from the coating film 50. Therefore, insulation can reliably be achieved between the adjacent external terminals 41, 42 (the vertical wirings 51, 52) and between the external terminals 43 (the vertical wirings 53) and the dummy terminals 45. As a result, the voltage resistance and the environmental resistance can be ensured in the inductor component 1. Since the regions of formation of the external terminals 41 to 43 and the dummy terminals 45 formed on the surfaces of the magnetic layer 10 can arbitrarily be set in accordance with the shape of the coating film 50, a degree of freedom can be increased at the time of mounting, and the external terminals 41 to 43 and the dummy terminals 45 can easily be formed.

In the inductor component 1, as shown in FIG. 3, the surfaces of the external terminals 41 to 43 are located on the outer side in the Z direction more than the surface of the first magnetic layer 11 or the second magnetic layer 12. Specifically, the external terminals 41 to 43 are embedded in the coating film 50, and the surfaces of the external terminals 41 to 43 are not flush with the surface of the first magnetic layer 11 or the second magnetic layer 12. In this case, a positional relationship can independently be set between the surface of the magnetic layer 10 and the surfaces of the external terminals 41 to 43, so that a degree of freedom can be increased in the thickness of the external terminals 41 to 43. The same applies to the dummy terminals 45 as is the case with the external terminals 41 to 43. According to this configuration, the height positions of the surfaces of the external terminals 41 to 43 can be adjusted in the inductor component 1. For example, when the inductor component 1 is embedded in the substrate, the height positions can be made coincident with those of external terminals of another embedded component. Therefore, by using the inductor component 1, a laser focusing process can be rationalized at the time of via formation in the substrate, so that the manufacturing efficiency of the substrate can be improved.

Furthermore, in the inductor component 1, as shown in FIG. 2, the areas of the external terminals 41 to 43 covering the end surfaces of the vertical wirings 51 to 53 (the columnar wirings 31 to 33) are larger than the areas of the vertical wirings 51 to 53 (the columnar wirings 31 to 33) when viewed in the Z direction. Therefore, the bonding area at the time of mounting becomes larger, and the inductor component 1 is improved in the mounting reliability. Additionally, an alignment margin can be ensured for a bonding position between the substrate wiring and the inductor component 1 at the time of mounting on the substrate, so that the mounting reliability can be enhanced. In this case, since the mounting reliability can be improved regardless of the volume of the columnar wirings 31 to 33, the cross-sectional areas of the columnar wirings 31 to 33 viewed in the Z direction can be made smaller to suppress a reduction in volume of the first magnetic layer 11 or the second magnetic layer 12 and to restrain the characteristics of the inductor component 1 from degrading.

In the inductor component 1, as shown in FIGS. 2 and 3, the spiral wirings 21, 22 include connecting portions 210 connected to the vertical wirings 51 to 53 (the via conductors 25), and the vertical wirings 52 on the side of the first magnetic layer 11 and the vertical wirings 53 on the side of the second magnetic layer 12 are connected to the common connecting portions 210 of the spiral wirings 21, 22. Therefore, the vertical wirings 52 and the vertical wirings 53 are connected to the same positions (the connecting portions 210) on the electric circuit in the spiral wirings 21, 22, so that the substrate wirings can be connected from either the upper surface side or the lower surface side of the inductor component 1 to the connecting portions 210.

The spiral wirings 21, 22, the vertical wirings 51 to 53 (the via conductors 25, the columnar wirings 31 to 33), the external terminals 41 to 43, and the dummy terminals 45 are preferably made of a material mainly composed of copper. As a result, the inexpensive low-resistance inductor component 1 can be provided. By using copper as a main component, improvements can also be achieved in the bonding force and conductivity for the spiral wirings 21, 22, the vertical wirings 51 to 53, the external terminals 41 to 43, and the dummy terminals 45.

In the magnetic layer 10, the thickness of the first magnetic layer 11 may be different from the thickness of the second magnetic layer 12. In this case, the properties of heat dissipation and noise propagation from the spiral wirings 21, 22 can be changed between the sides of the first magnetic layer 11 and the second magnetic layer 12, and the degree of freedom in design of the inductor component 1 can be increased. Also in this case, the vertical wirings 51 to 53 may be configured to penetrate the inside of the thicker one between the first magnetic layer 11 and the second magnetic layer 12. As a result, after the inductor component 1 is mounted on the substrate, the thicker magnetic layer can be disposed between an external circuit of the substrate connected through the vertical wirings 51 to 53 and the spiral wirings 21, 22, and the noise propagation to the external circuit can be suppressed. If the thickness of the first magnetic layer 11 is different from the thickness of the second magnetic layer 12, the dummy terminals 45 may be disposed on the surface of the thinner one between the first magnetic layer 11 and the second magnetic layer 12. As a result, the heat dissipation effect can be improved.

However, in the inductor component 1, the thickness of the first magnetic layer 11 and the thickness of the second magnetic layer 12 may be substantially the same. In this case, the magnetic resistance of the inductor can be minimized and, therefore, the inductance value can be made higher.

The inductor component 1 includes the insulating layer 15 disposed between the first magnetic layer 11 and the second magnetic layer 12 with the spiral wirings 21, 22 embedded therein. Since this enables the inductor component 1 to eliminate the possibility of formation of an electrical short-circuit path through a magnetic material such as a metallic magnetic substance between the wirings even when a space between the wirings is very narrow, the highly reliable inductor component can be provided. However, the insulating layer 15 may be made of a magnetic material to form a portion of the magnetic layer 10. Assuming that the chip size is the same, the volume of the magnetic layer 10 increases if the insulating layer 15 is a portion of the magnetic layer 10, so that the inductance value can be made higher. In this case, the vertical wirings 51 to 53 may be configured such that the via conductors 25 and the columnar wirings 31 to 33 are integrated without being distinguished from each other.

Although the inductor component 1 includes the two spiral wirings 21, 22 wound on the same plane, the present disclosure is not limited to this configuration, and only one spiral wiring 21, 22 may be included or three or more spiral wirings may be arranged.

However, since the inductor component 1 has a higher degree of freedom in formation of the external terminals 41 to 43, the effect thereof becomes more remarkable in an inductor component having a larger number of external terminals.

Example

An example of the inductor component 1 will be described.

The spiral wirings 21, 22, the vertical wirings 51 to 53 (the via conductors 25, the columnar wirings 31 to 33), the external terminals 41 to 43, and the dummy terminals 45 are made of low resistance metal such as Cu, Ag, and Au, for example. Preferably, the spiral wirings 21, 22 with a low resistance and a narrow pitch can inexpensively be formed by using copper plating formed by SAP (semi additive process). The spiral wirings 21, 22, the vertical wirings 51 to 53, the external terminals 41 to 43, and the dummy terminals 45 may be formed by a plating method other than SAP, a sputtering method, a vapor deposition method, an application method, etc.

In this example, the spiral wirings 21, 22 and the vertical wirings 51 to 53 are formed by copper plating with SAP, and the external terminals 41 to 43 and the dummy terminals 45 are formed by electroless Cu plating. It is noted that the spiral wirings 21, 22, the vertical wirings 51 to 53 (the via conductors 25, the columnar wirings 31 to 33), the external terminals 41 to 43, and the dummy terminals 45 may all be formed by the same construction method.

The magnetic layer 10 (the first magnetic layer 11, the second magnetic layer 12, the inner magnetic path parts 13, and the outer magnetic path part 14) is made of a resin containing a powder of a magnetic material, for example, and preferably contains a substantially spherical metallic magnetic material. Therefore, the filling property of the magnetic material in the magnetic paths can be made favorable. As a result, the magnetic paths can be made smaller so as to provide the small-sized inductor component 1. However, the magnetic layer may be made of a resin containing a powder of a magnetic material such as ferrite, or may be formed by sintering a ferrite substrate or a green sheet of a magnetic material.

In this example, the resin constituting the magnetic layer 10 is an organic insulating material made of an epoxy resin, bismaleimide, liquid crystal polymer, or polyimide, for example. The magnetic material powder of the magnetic layer 10 is a metallic magnetic substance having an average particle diameter of 5 μm or less. The metallic magnetic substance is, for example, an FeSi alloy such as FeSiCr, an FeCo alloy, an Fe alloy such as NiFe, or an amorphous alloy thereof. The content percentage of the magnetic material is preferably 50 vol % or more and 85 vol % or less relative to the whole magnetic layer 10.

By using a magnetic material having a small particle diameter such as an average particle diameter of 5 μm or less as described above, an eddy current generated in a metallic magnetic substance can be suppressed so as to provide the inductor component 1 with a smaller loss even at a high frequency such as tens of MHz.

By using an Fe-based magnetic material, larger magnetic saturation characteristics can be acquired as compared to ferrite etc.

By setting a filling amount of the magnetic material to 50 vol % or more, the magnetic permeability can be increased and the number of turns of a spiral wiring required for acquiring a desired inductance value can be reduced so as to decrease loss at high frequencies due to a direct-current resistance and a proximity effect. Furthermore, when the filling amount is 85 vol % or less, since the volume of the organic insulating resin is sufficiently large with respect to the magnetic material and the flowability of the magnetic material can be ensured, the filling property is improved so that the effective magnetic permeability and the strength of the magnetic material itself can be increased.

In this example, the coating film 50 is formed of a photosensitive resist or a solder resist made of an organic insulating resin such as polyimide, phenol, an epoxy resin, etc.

The rust prevention treatment applied to the surfaces of the external terminals 41 to 43 and the dummy terminals 45 is a plating of Ni, Au, Sn, etc.

In this example, the insulating layer 15 is made of a resin containing an $SiO_2$ filler having an average particle size of 0.5 μm or less, for example. However, the filler is not an essential constituent element of the insulating layer 15.

In this example, the spiral wirings 21, 22 have the wiring width of 50 μm, the inter-wiring space of 10 μm, and the wiring thickness of 45 μm.

The inter-wiring space is preferably 20 μm or less and 3 μm or more. By setting the inter-wiring space to 20 μm or less, the wiring width can be made larger, so that the direct-current resistance can be lowered. By setting the inter-wiring space to 3 μm or more, sufficient insulation can be kept between the wirings.

The wiring thickness is preferably 40 μm or more and 120 μm or less. By setting the wiring thickness to 40 μm or more, the direct-current resistance can sufficiently be lowered. By setting the wiring thickness to 120 μm or less, a wiring aspect is prevented from becoming extremely large, and process variations can be suppressed.

The insulating layer 15 has the thickness of 10 μm between the spiral wirings 21, 22 and the first magnetic layer 11 and between the spiral wirings 21, 22 and the second magnetic layer 12, and the insulating layer 15 has the thickness of 35 μm between the inner magnetic path parts 13 and the spiral wiring 21, 22.

The insulating layer 15 preferably has a width of 3 μm or more and 20 μm or less between the spiral wirings 21, 22 and the first magnetic layer 11 or the second magnetic layer 12. By keeping a distance of 3 μm or more, the spiral wirings 21, 22 can reliably be prevented from coming into contact with the first magnetic layer 11 and the second magnetic layer 12, and the thinning of the inductor component 1 can be achieved by setting the distance to 20 μm or less.

The insulating layer 15 preferably has a width of 3 μm or more and 45 μm or less between the inner magnetic path parts 13 and the spiral wirings 21, 22. By keeping a distance of 3 μm or more, the spiral wirings 21, 22 can reliably be prevented from coming into contact with the inner magnetic path parts 13, and by setting the distance to 45 μm or less, the inner magnetic path part 13 or the outer magnetic path part 14 can be made wider, so that the magnetic saturation characteristics are improved and the inductance value can be made higher.

In this embodiment, the number of turns of each of the spiral wirings 21, 22 are 2.5. The number of turns is preferably five or less. If the number of turns is five or less, the loss of the proximity effect can be reduced for a high-frequency switching operation such as from 50 MHz to 150 MHz.

In this example, the first magnetic layer 11 and the second magnetic layer 12 each have the thickness of 20 μm. The thickness of the first and second magnetic layers 11, 12 is preferably 10 μm or more and 100 μm or less. If the thickness of the first and second magnetic layers 11, 12 is too thin, the spiral wirings 21, 22 may be exposed due to process variations during grinding of the first and second magnetic layers 11, 12. If the thickness of the first and second magnetic layers 11, 12 is small with respect to the average particle diameter of the magnetic material contained in the first and second magnetic layers 11, 12, the effective permeability is significantly decreased due to shedding of particles. By setting the thickness of the first and second magnetic layers 11, 12 to 100 μm or less, the inductor component can be formed into a thin film.

The thickness of the external terminals 41 to 43 and the dummy terminals 45 including the rust prevention treatment is made up of the electroless copper plating thickness of 5 μm, the Ni plating thickness of 5 μm, and the Au plating thickness of 0.1 μm. The thickness of the coating film 50 is 10 μm. Also for these thicknesses, a thickness and a size may appropriately be selected from the viewpoint of chip thickness and mounting reliability.

From the above, according to this example, since the internal magnetic path part 13 can be made relatively large despite the chip size of 1010 (1.0 mm×1.0 mm) and the thickness of 0.125 mm (the inner magnetic path part 13 of this example has a short side of 0.12 mm, which is sufficiently larger than the particle diameter of the metallic magnetic substance), the thin inductor with high magnetic saturation characteristics can be provided.

(Manufacturing Method)

A manufacturing method of the inductor component 1 will be described.

Figure 4A:
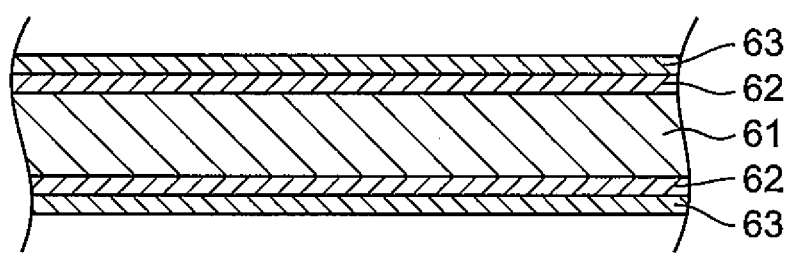
FIG. 4A is an explanatory view for explaining a manufacturing method of the inductor component according to the first embodiment.

A dummy core substrate 61 is prepared as shown in FIG. 4A. The dummy core substrate 61 has a substrate copper foil on both sides. In this example, the dummy core substrate 61 is a glass epoxy substrate. Since the thickness of the dummy core substrate 61 does not affect the thickness of the inductor component, the substrate with easy-to-handle thickness may appropriately be used for the reason of warpage due to processing etc.

A copper foil 62 is then bonded onto a surface of the substrate copper foil. The copper foil 62 is bonded to a smooth surface of the substrate copper foil. Therefore, an adhesion force can be made weak between the copper foil 62 and the substrate copper foil and, at a subsequent step, the dummy core substrate 61 can easily be peeled from the copper foil 62. Preferably, an adhesive bonding the dummy core substrate 61 and the dummy metal layer (the copper foil 62) is an adhesive with low tackiness. For weakening of the adhesion force between the dummy core substrate 61 and the copper foil 62, it is desirable that the bonding surfaces of the dummy core substrate 61 and the copper foil 62 are glossy surfaces.

Subsequently, an insulating layer 63 is laminated on the copper foil 62. In this case, the insulating layer 63 is thermally press-bonded and thermally cured by a vacuum laminator, a press machine, etc.

Figure 4B:
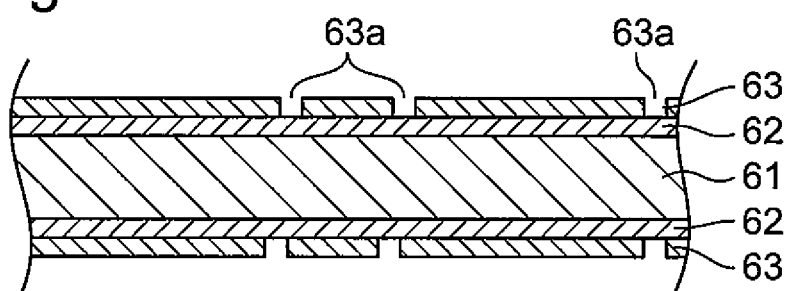
FIG. 4B is an explanatory view for explaining a manufacturing method of the inductor component according to the first embodiment.
Figure 4C:
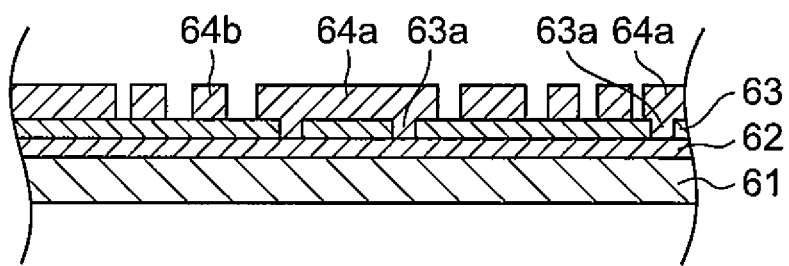
FIG. 4C is an explanatory view for explaining the manufacturing method of the inductor component according to the first embodiment.

As shown in FIG. 4B, an opening part 63a is formed by laser processing etc. in the insulating layer 63. As shown in FIG. 4C, a dummy copper 64a and a spiral wiring 64b are formed on the insulating layer 63. Specifically, a power supply film (not shown) for SAP is formed on the insulating layer 63 by electroless plating, sputtering, vapor deposition, etc. After formation of the power feeding film, a photosensitive resist is applied or pasted onto the power feeding film, and the opening part of the photosensitive resist is formed in a place serving as a wiring pattern by photolithography. Subsequently, a metal wiring corresponding to the dummy copper 64a and the spiral wiring 64b is formed in the opening part of the photosensitive resist layer. After the formation of the metal wiring, the photosensitive resist is peeled and removed by a chemical liquid, and the power feeding film is etched and removed. This metal wiring is subsequently used as a power feeding part to acquire narrow-space wirings by applying additional copper electrolytic plating. The opening part 63a formed by SAP in FIG. 4B is filled with copper.

Figure 4D:
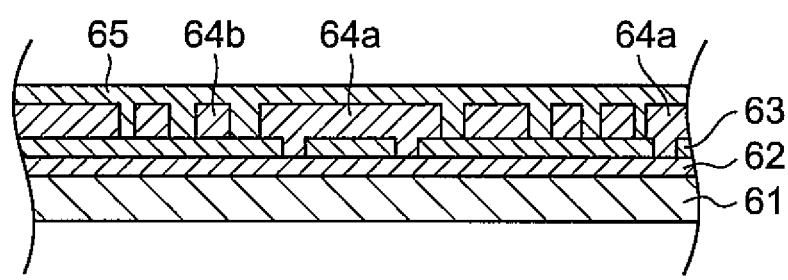
FIG. 4D is an explanatory view for explaining the manufacturing method of the inductor component according to the first embodiment.

As shown in FIG. 4D, the dummy copper 64a and the spiral wiring 64b are covered with an insulating layer 65.

The insulating layer 65 is thermally press-bonded and thermally cured by a vacuum laminator, a press machine, etc.

Figure 4E:
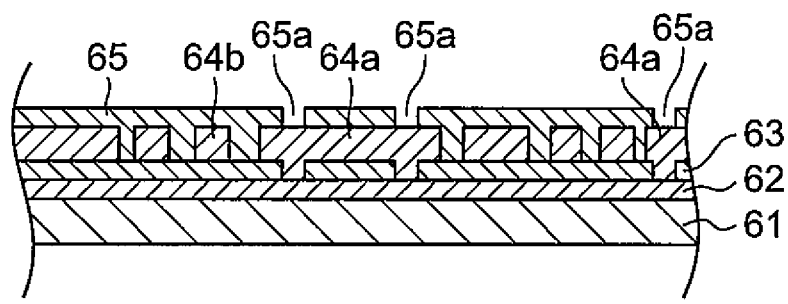
FIG. 4E is an explanatory view for explaining the manufacturing method of the inductor component according to the first embodiment.

As shown in FIG. 4E, an opening part 65a is then formed in the insulating layer 65 by laser processing etc.

Figure 4F:
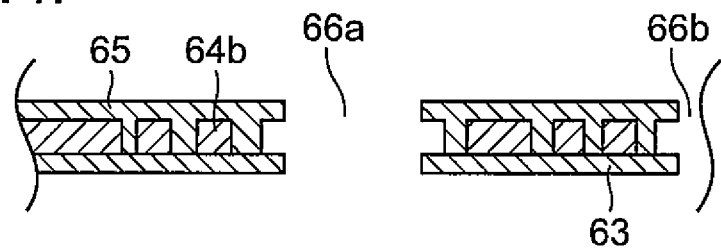
FIG. 4F is an explanatory view for explaining the manufacturing method of the inductor component according to the first embodiment.

Subsequently, the dummy core substrate 61 is peeled off from the copper foil 62. The copper foil 62 is removed by etching etc., and the dummy copper 64a is removed by etching etc., before forming a hole part 66a corresponding to the inner magnetic path part 13 and a hole part 66b corresponding to the outer magnetic path part 14 as shown in FIG. 4F.

Figure 4G:
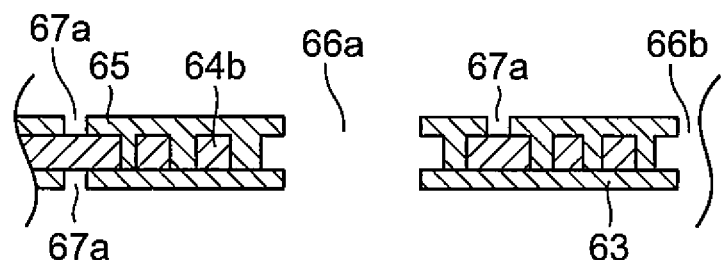
FIG. 4G is an explanatory view for explaining the manufacturing method of the inductor component according to the first embodiment.
Figure 4H:
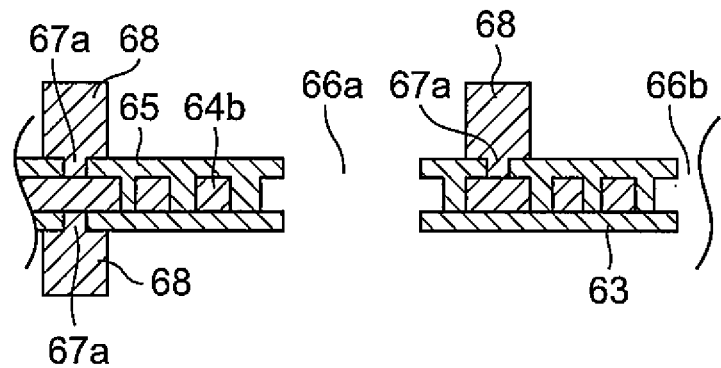
FIG. 4H is an explanatory view for explaining the manufacturing method of the inductor component according to the first embodiment.

Subsequently, as shown in FIG. 4G, an insulating layer opening part 67a is formed by laser processing etc. As shown in FIG. 4H, the insulating layer opening part 67a is then filled with copper by SAP and a columnar wiring 68 is formed on the insulating layer 65.

Figure 4I:
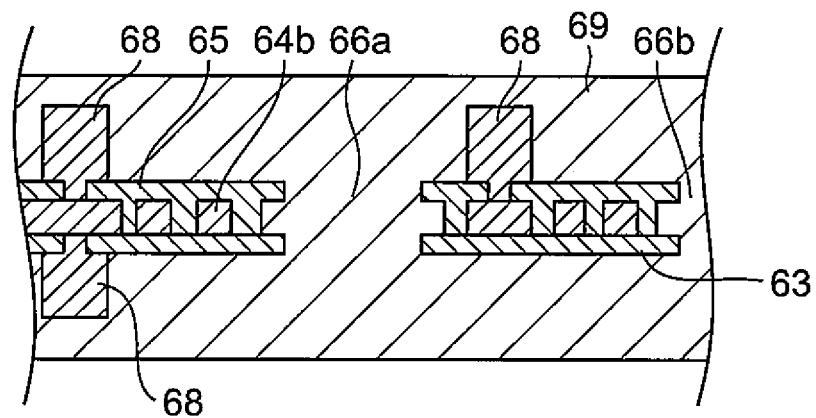
FIG. 4I is an explanatory view for explaining the manufacturing method of the inductor component according to the first embodiment.

As shown in FIG. 4I, the spiral wiring, the insulating layer, and the columnar wiring are covered with a magnetic material (magnetic layer) 69 to form an inductor substrate. The magnetic material 69 is thermally press-bonded and thermally cured by a vacuum laminator, a press machine, etc. At this time, the magnetic material 69 is also filled into the hole parts 66a, 66b.

Figure 4J:
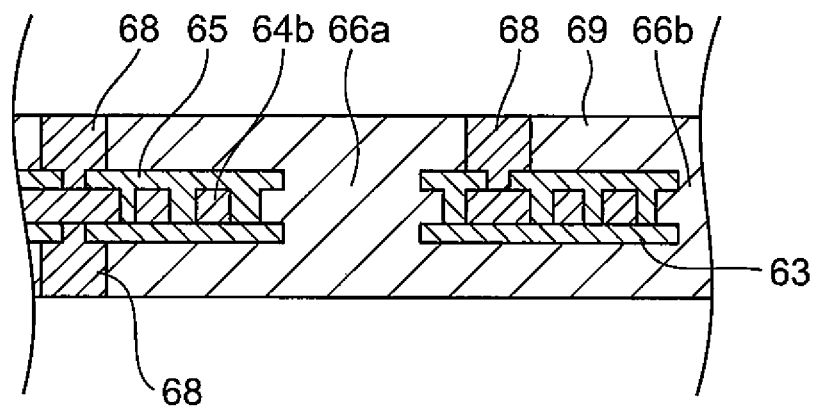
FIG. 4J is an explanatory view for explaining the manufacturing method of the inductor component according to the first embodiment.

As shown in FIG. 4J, the magnetic material 69 on the upper and lower sides of the inductor substrate is reduced in thickness by a grinding method. In this case, the columnar wiring 68 is partially exposed so that an exposed portion of the columnar wiring 68 is formed on the same plane as the magnetic material 69. In this case, by grinding the magnetic material 69 to a thickness sufficient for acquiring an inductance value, the inductor component can be made thinner.

Figure 4K:
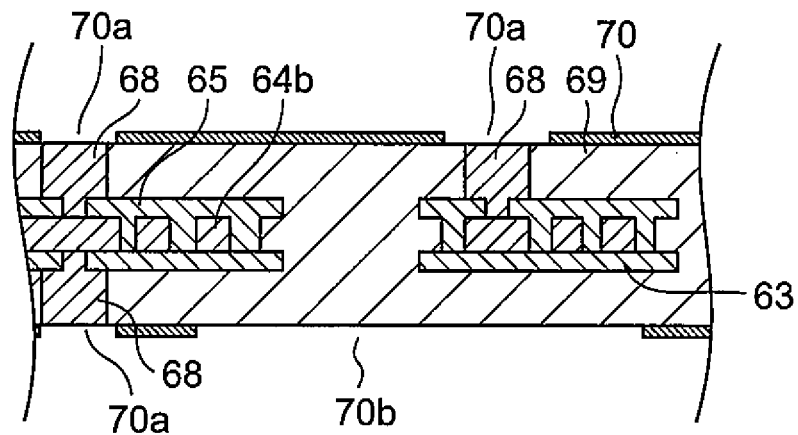
FIG. 4K is an explanatory view for explaining the manufacturing method of the inductor component according to the first embodiment.

Subsequently, as shown in FIG. 4K, an insulating resin (coating film) 70 is formed on a magnetic substance surface by a printing method. An opening part 70a of the insulating resin 70 is used as a portion for formation of an external terminal. Although the printing method is used in this example, the opening part 70a may be formed by a photolithography method.

Figure 4L:
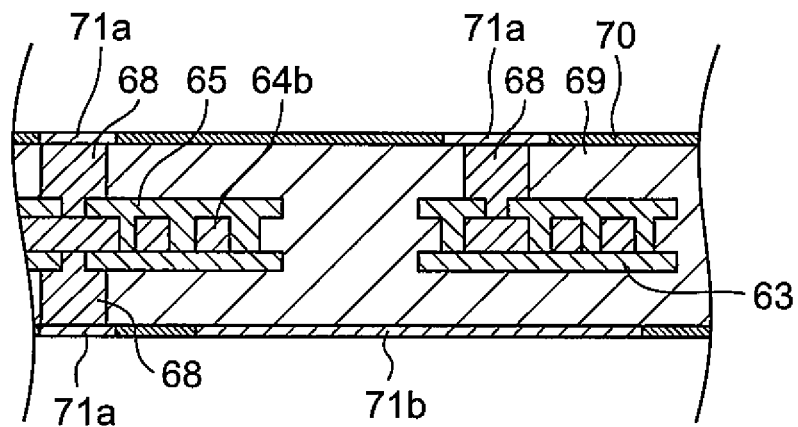
FIG. 4L is an explanatory view for explaining the manufacturing method of the inductor component according to the first embodiment.
Figure 4M:
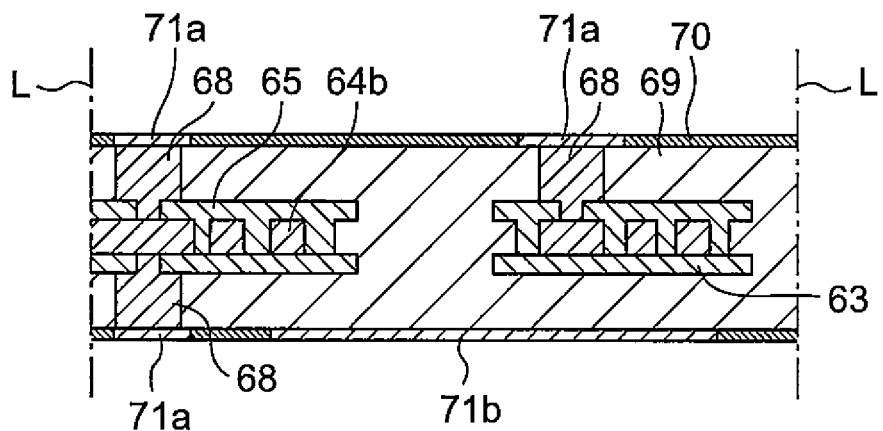
FIG. 4M is an explanatory view for explaining the manufacturing method of the inductor component according to the first embodiment.

As shown in FIG. 4L, an electroless copper plating or a plating film of Ni and Au etc. is applied to form an external terminal 71a and a dummy terminal 71b and, as shown in FIG. 4M, dicing is performed along broken line portions L to form individual pieces so as to acquire the inductor component of FIG. 3. Although not shown after FIG. 4B, the inductor substrates may be formed on both surfaces of the dummy core substrate 61. As a result, higher productivity can be achieved.

Second Embodiment (Configuration)

Figure 5A:
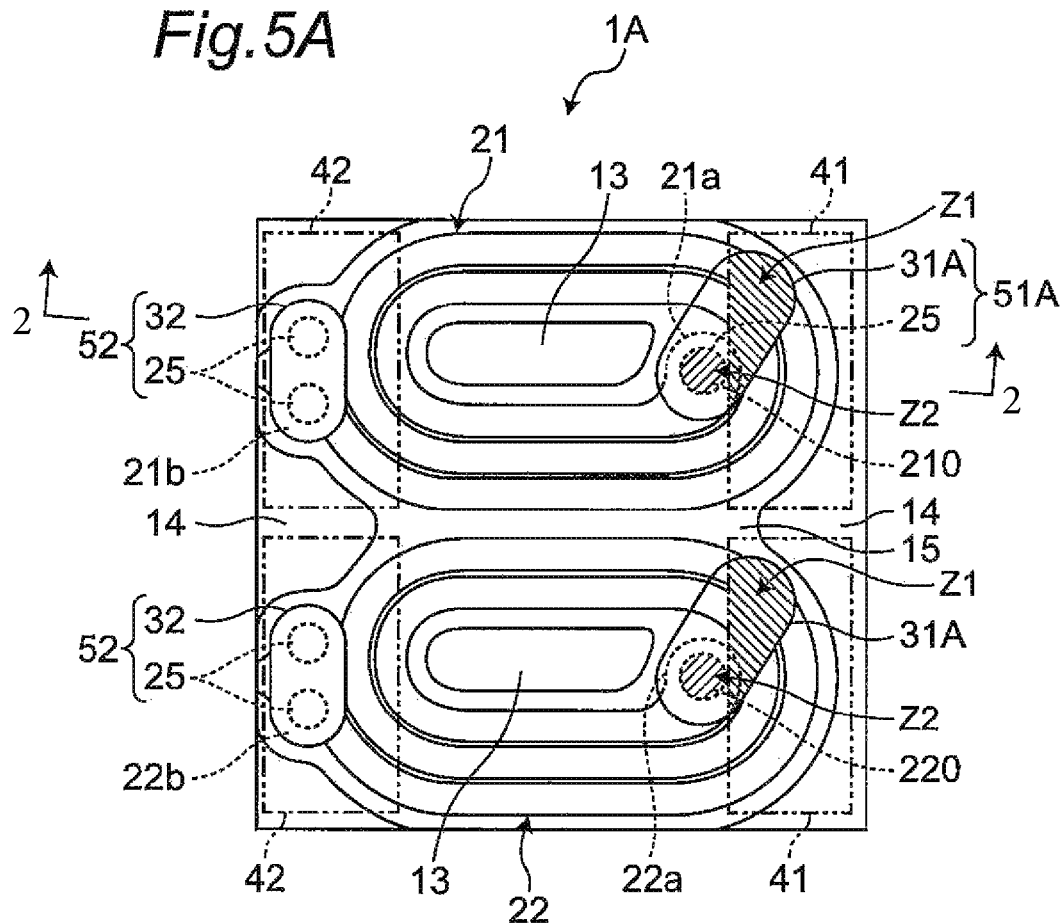
FIG. 5A is a transparent plane view of an inductor component according to a second embodiment.
Figure 5B:
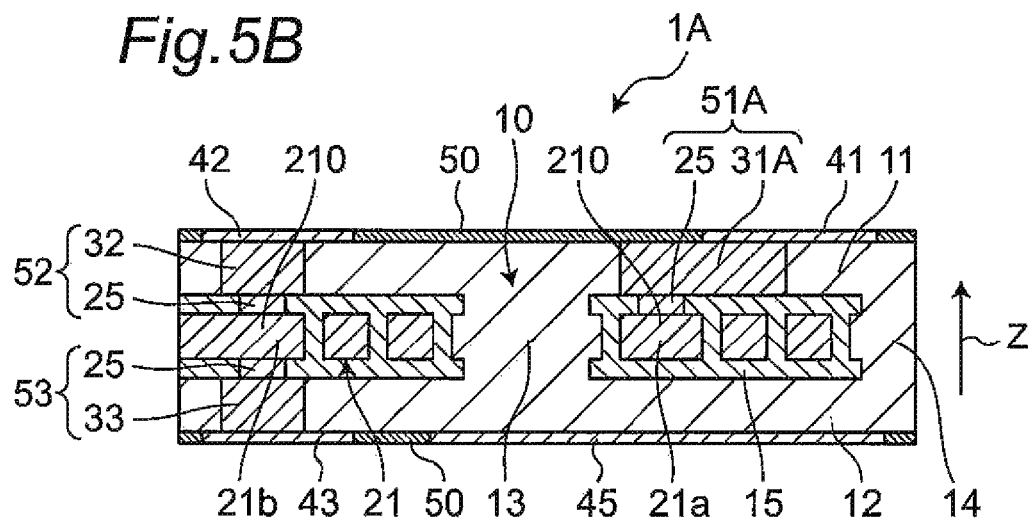
FIG. 5B is a cross-sectional view of the inductor component according to the second embodiment.

FIG. 5A is a perspective plane view of a second embodiment of an inductor component. FIG. 5B is a cross-sectional view taken along 2-2 of FIG. 5A. The second embodiment is different from the first embodiment in the configuration of the first vertical wirings (the first columnar wirings). This different configuration will hereinafter be described. In the second embodiment, the same constituent elements as the first embodiment are denoted by the same reference numerals as the first embodiment and therefore will not be described.

As shown in FIGS. 5A and 5B, as is the case with the inductor component 1, an inductor component 1A includes vertical wirings 51A, 52, 53 extending from the spiral wirings 21, 22 in the Z direction to penetrate the inside of the first magnetic layer 11 or the second magnetic layer 12. On the other hand, in the inductor component 1A, the connecting portion 210 of the first spiral wiring 21 and the first external terminal 41 are connected to the common first vertical wiring 51A. A first columnar wiring 31A included in the first vertical wiring 51A has a shape extending in the Z direction and also extending in a direction orthogonal to the Z direction from a contact surface with the via conductor 25. Therefore, when viewed in the z direction, an end surface (a contact surface between the first columnar wiring 31A and the first external terminal 41) Z1 of the first vertical wiring 51A exposed from the coating film 50 is at a position displaced with respect to a contact surface (a contact surface between the via conductor 25 and the connecting portion 210) Z2 between the first vertical wiring 51A and the first spiral wiring 21. It is noted that the end surface Z1 being displaced with respect to the contact surface Z2 viewed in the Z direction refers to a positional relationship excluding the case of the end surface Z1 and the contact surface Z2 completely overlapping with each other when viewed in the Z direction, and the end surface Z1 and the contact surface Z2 may partially overlap with each other or may not overlap at all.

Therefore, in the inductor component 1A, because of the first columnar wiring 31A extending in the Z direction and also extending in the direction orthogonal to the Z direction, the position of the first external terminal 41 can freely be set independently of the contact surface of the via conductor 25 with the connecting portion 210 of the spiral wiring 21. Specifically, when the via conductor 25 is connected to the inner circumferential end 21a, the position of the first external terminal 41 can be located symmetrically with the second external terminal 42 with respect to the center of the inductor component 1A without increasing the thickness of the inductor component 1A, so that the mounting reliability can be improved. As can be understood from the above description, the position of the end surface of the first vertical wiring 51A exposed from the coating film 50 can freely be set independently of the contact surface with the spiral wiring 21 and, therefore, the via conductor 25 and the first external terminal 41 are not essential components for the inductor component 1A. Although only the side of the first spiral wiring 21 has been described in the above description, the same applies to the side of the second spiral wiring 22.

Particularly, in the case of an inductor formed by serially connecting the odd-layer spiral wirings 21, 22 having the number of turns greater than 0.5, one end portion of the inductor is located outside and the other end portion is located inside of the spiral wirings. As the number of turns increases, the end portion disposed at the innermost circumferential portion of the inductor comes closer to the center of the chip. If the first external terminal 41 is formed immediately above the inner circumferential end portion of the inductor in this state, the distance to the other external terminals 42, 43 becomes too narrow, causing problems such as a reduction in voltage resistance, a short circuit at the time of mounting, and a tilt of a chip at the time of mounting.

On the other hand, if a wiring layer is formed again on the spiral wirings 21, 22 for routing of a wiring to the first external terminal 41, an additional wiring formation step leads to an increased cost and an additional wiring thickness becomes an inhibiting factor for forming a chip into a thin film.

Therefore, by extending the first columnar wiring 41A in a direction orthogonal to the Z direction, the first external terminal 41 can be disposed on the outer side of the chip regardless of the number of turns without increasing a wiring processing step and a chip thickness, and the external terminals 41 to 43 can freely be formed.

In the end surfaces of the first columnar wirings 31A exposed on the surface of the first magnetic layer 11, portions not in contact with the first external terminals 41 are covered with the coating film 50, so that the insulation is ensured.

The direction of the first columnar wiring 31A extending orthogonally to the Z direction is preferably a direction not interfering with the magnetic fluxes generated by the spiral wirings 21, 22. The direction not interfering with the magnetic fluxes generated by the spiral wirings 21, 22 is the direction causing no substantial reduction in the number of turns of the spiral wirings 21, 22. This makes it possible to suppress a decrease in the inductance value due to a reduction in volume of the material of the magnetic layer.

Specifically, for example, in FIG. 5A, for example, the spiral wiring 21 is wound counterclockwise from the outer circumferential end 21b and is directed toward the upper right on the plane of FIG. 5A at the connecting portion 210 (the inner circumferential end 21a), and the first columnar wiring 31A further extends from the connecting portion 210 to the upper right on the plane. In this case, the magnetic flux generated by a current flowing through the first columnar wiring 31A does not cancel the magnetic flux generated by a current flowing through the spiral wirings 21, 22, and the inductance value does not decrease. On the other hand, if the first columnar wiring 31A shown in FIG. 5A is rotated by 90 degrees counterclockwise around the connecting portion 210 of the first spiral wiring 21, the first columnar wiring 31A can be connected to the external terminal 41 in the same way; however, the winding is reversed relative to the spiral wiring 21 in terms of the number of turns. Therefore, the magnetic flux generated by a current flowing through the first columnar wiring 31A cancels the magnetic flux generated by a current flowing through the spiral wiring 21, and the inductance value decreases.

Example

An example of the inductor component 1A will be described.

In this example, the inductor component has the chip size of 1010 (1.0 mm×1.0 mm), the thickness of 0.125 mm, the spiral wiring L/S/t=50/10/45 μm, and the number of turns of 2.5.

The outer diameter of the connecting portions 210, 220 of the spiral wirings 21, 22 is larger by 20 μm or more than the outer diameter of the via conductors 25. This makes it possible to restrain a via hole from being shifted away due to misalignment at the time of laser processing. The columnar wirings 31A extend in the Z direction and have a large columnar wiring width to the extent of causing contact with the external terminals. In this case, the width of the columnar wirings 31A is defined as the width along the plane direction of formation of the spiral wirings 21, 22.

Third Embodiment (Configuration)

Figure 6A:
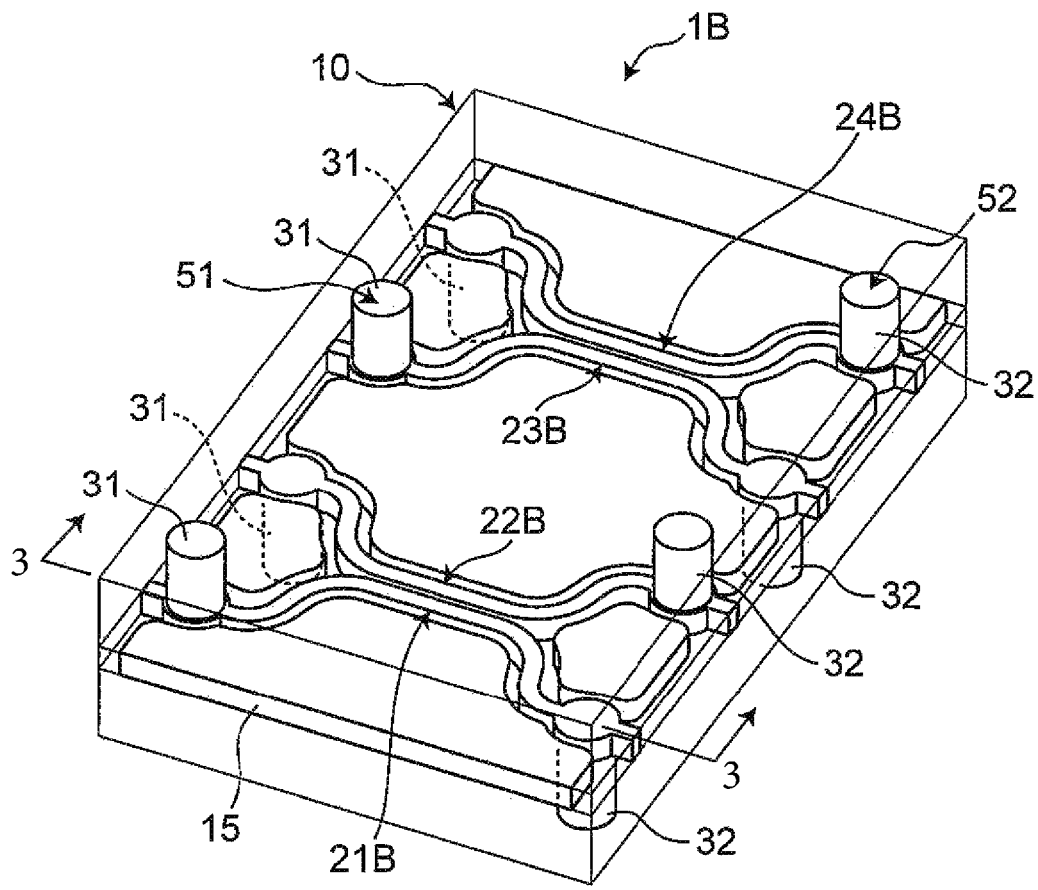
FIG. 6A is a transparent perspective view of an inductor component according to a third embodiment.
Figure 6B:
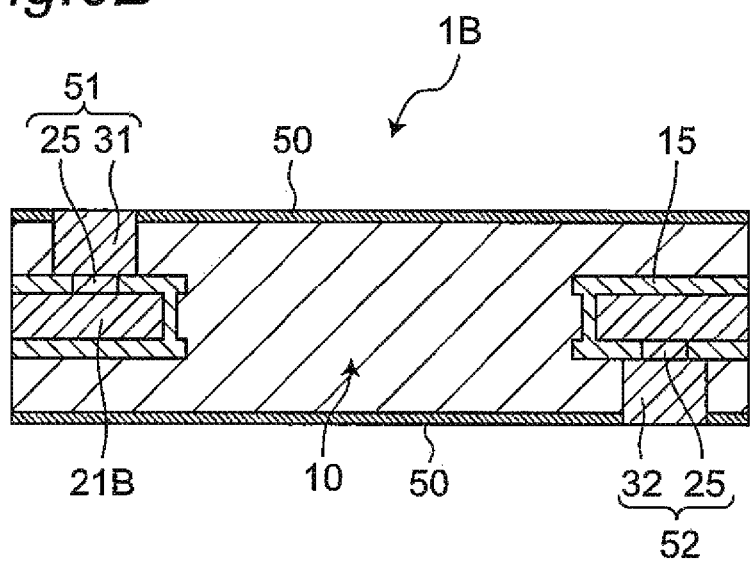
FIG. 6B is a cross-sectional view of the inductor component according to the third embodiment.

FIG. 6A is a transparent perspective view of a third embodiment of an inductor component. FIG. 6B is a cross-sectional view taken along 3-3 of FIG. 6A. The third embodiment is different from the first embodiment in the configuration of the spiral wirings. This different configuration will hereinafter be described. In the third embodiment, the same constituent elements as the first embodiment are denoted by the same reference numerals as the other embodiments and therefore will not be described.

As shown in FIGS. 6A and 6B, as is the case with the inductor component 1, an inductor component 1B includes the vertical wirings 51, 52 extending from spiral wirings 21B to 24B in the Z direction to penetrate the inside of the first magnetic layer 11 or the second magnetic layer 12. On the other hand, the inductor component 1B has the first spiral wiring 21B, the second spiral wiring 22B, the third spiral wiring 23B, and the fourth spiral wiring 24B each having a semi-elliptical arc shape when viewed in the Z direction. Therefore, each of the spiral wirings 21B to 24B is a curved wiring wound around about a half of the circumference. The spiral wirings 21B to 24B each include a linear part in a middle portion. As described above, in this example, a "spiral wiring wound into a planar shape" may be a curve (two-dimensional curve) formed into a planar shape with the number of turns less than one and may have a portion that is a linear part.

The first and fourth spiral wirings 21B, 24B each have both ends connected to the first vertical wiring 51 and the second vertical wiring 52 located on the outer side and have a curved shape drawing an arc from the first vertical wiring 51 and the second vertical wiring 52 toward the center side of the inductor component 1B.

The second and third spiral wirings 22B, 23B each have both ends connected to the first vertical wiring 51 (the via conductor 25, the first columnar wiring 31) and the second vertical wiring 52 (the via conductor 25, the second columnar wiring 32) located on the inner side and have a curved shape drawing an arc from the first vertical wiring 51 and the second vertical wiring 52 toward an edge side of the inductor component 1B.

It is assumed that an inner diameter portion of each of the first to fourth spiral wirings 21B to 24B is defined as an area surrounded by the curve drawn by the spiral wirings 21B to 24B and the straight line connecting both ends of the spiral wirings 21B to 24B. In this case, none of the spiral wirings 21B to 24B have the inner diameter portions overlapping with each other when viewed in the Z direction.

On the other hand, the first and second spiral wirings 21B, 22B are close to each other. Therefore, the magnetic flux generated in the first spiral wiring 21B goes around the adjacent second spiral wiring 22B, and the magnetic flux generated in the second spiral wiring 22B goes around the adjacent first spiral wiring 21B. The same applies to the third and fourth spiral wirings 23B, 24B arranged close to each other. Therefore, this strengthens the magnetic coupling between the first spiral wiring 21B and the second spiral wiring 22B and the magnetic coupling between the third spiral wiring 23B and the fourth spiral wiring 24B.

When currents flow simultaneously through the first and second spiral wirings 21B, 22B from the ends on the same side to the other ends on the opposite side, the magnetic fluxes strengthen each other. This means that when the ends on the same side of the first spiral wiring 21B and the second spiral wiring 22B are both used as the input side of pulse signals and the other ends on the opposite side are both used as the output side of the pulse signals, the first spiral wiring 21B and the second spiral wiring 22B are positively coupled. On the other hand, for example, when one of the first spiral wiring 21B and the second spiral wiring 22B has one end side used for input and the other end side used for output while the other spiral wiring has one end side used for output and the other end side used for input, the first spiral wiring 21B and the second spiral wiring 22B can be put into a negatively coupled state. The same applies to the third and fourth spiral wirings 23B, 24B.

The first vertical wirings 51 connected to the one end sides of the first and third spiral wirings 21B, 23B and the second vertical wirings 52 connected to the other end sides of the second and fourth spiral wirings 22B, 24B each penetrate the inside of the first magnetic layer 11 and are exposed on the upper surface. The second vertical wirings 52 connected to the other end sides of the first and third spiral wirings 21B, 23B and the first vertical wirings 51 connected to the one end sides of the second and fourth spiral wirings 22B, 24B each penetrate the inside of the second magnetic layer 12 and are exposed on the lower surface.

According to this configuration, for example, a set of the first and second spiral wirings 21B, 22B and a set of the third and fourth spiral wirings 23B, 24B can each more easily negatively be coupled by embedding the inductor component 1B in a substrate, disposing a pulse signal input line on the upper surface side of the first magnetic layer 11, and disposing a pulse signal output line on the lower surface side of the second magnetic layer 12.

It is noted that the inductor component 1B has wirings further extending toward the outside of the chip from the connecting positions of the spiral wirings 21B to 24B to the vertical wirings 51, 52 and these wirings are those connected to a power feeding wiring when an additional copper electrolytic plating is performed after a copper wiring is formed by SAP. The additional copper electrolytic plating can easily be performed through this power feeding wiring even after the power feeding film of SAP is removed, and an inter-wiring distance can be narrowed. Additionally, by performing an additional copper electrode plating after SAP formation, the inter-wiring distance of the first and second spiral wirings 21B, 22B and the inter-wiring distance of the third and fourth spiral wirings 23B, 24B can be narrowed to achieve high magnetic coupling.

Example

An example of the inductor component 1B will be described.

In this example, the inductor component has the chip size of 20125 (2.0 mm×1.25 mm), the thickness of 0.285 mm, the spiral wiring L/S/t=50/10/45 μm, and the magnetic layer thickness of 100 μm each on the upper and lower sides. The number of turns of the spiral wiring is 0.5 or less.

In this example, the minimum inter-wiring distance between the first spiral wiring 21B and the second spiral wiring 22B or between the third spiral wiring 23B and the fourth spiral wiring 24B is 10 μm. The inter-wiring distance between the second spiral wiring 22B and the third spiral wiring 23B is larger than this distance. This makes it possible to strengthen the magnetic coupling between the first spiral wiring 21B and the second spiral wiring 22B and between the third spiral wiring 23B and the fourth spiral wiring 24B. In this example, the magnetic coupling between the first spiral wiring 21B and the second spiral wiring 22B and between the third spiral wiring 23B and the fourth spiral wiring 24B is four or more times as strong as the magnetic coupling between the second spiral wiring 22B and the third spiral wiring 23B.

Fourth Embodiment (Configuration)

Figure 7A:
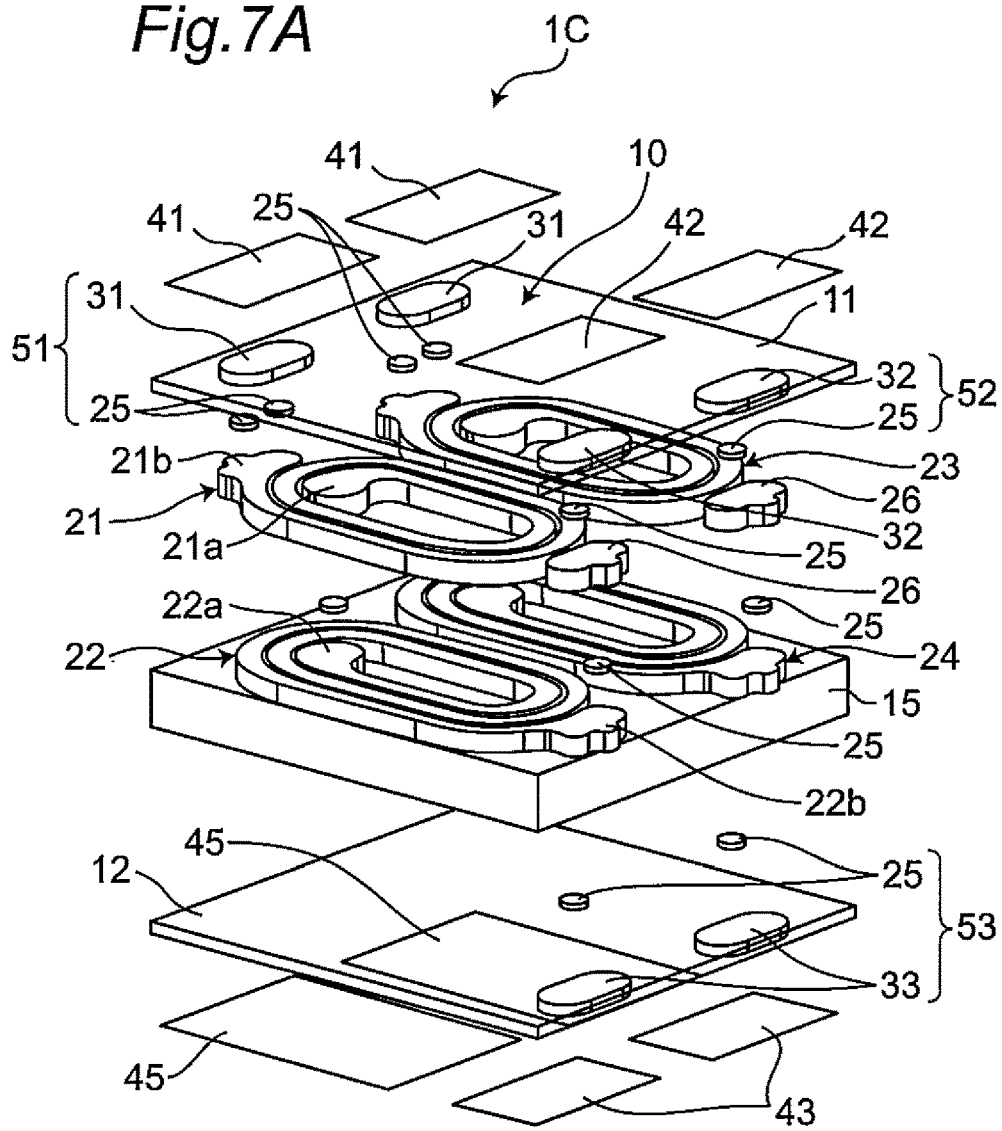
FIG. 7A is an exploded transparent perspective view of an inductor component according to a fourth embodiment.
Figure 7B:
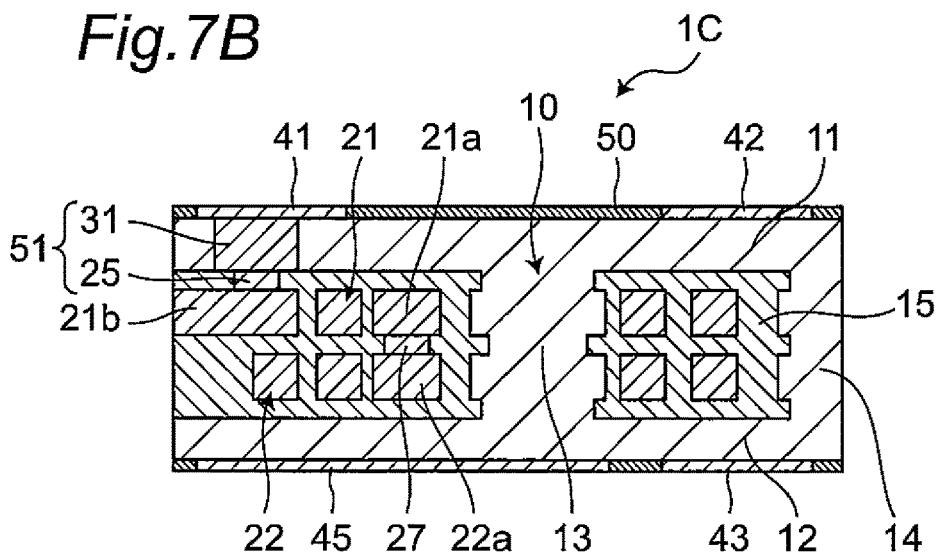
FIG. 7B is a cross-sectional view of the inductor component according to the fourth embodiment.

FIG. 7A is an exploded transparent perspective view of a fourth embodiment of an inductor component. FIG. 7B is a cross-sectional view of the inductor component. The fourth embodiment is different from the first embodiment in the configuration of the spiral wirings. This different configuration will hereinafter be described. In the fourth embodiment, the same constituent elements as the first embodiment are denoted by the same reference numerals as the other embodiments and therefore will not be described.

As shown in FIGS. 7A and 7B, as is the case with the inductor component 1, an inductor component 1C includes the vertical wirings 51 to 53 extending from spiral wirings 21 to 24 in the Z direction to penetrate the inside of the first magnetic layer 11 or the second magnetic layer 12. In FIG. 7A, the inner magnetic path part 13 and the outer magnetic path part 14 of FIG. 7B are not shown.

On the other hand, the inductor component 1C has the first spiral wiring 21 and the second spiral wiring 22 as a plurality of spiral wirings and further includes a second via conductor 27 connecting the first spiral wiring 21 and the second spiral wiring 22 in series. Specifically, the first spiral wiring 21 and the second spiral wiring 22 are laminated in the Z direction. The first spiral wiring 21 is spirally wound in a counter-clockwise direction from the outer circumferential end 21b toward the inner circumferential end 21a when viewed from the upper side. The second spiral wiring 22 is spirally wound in a counterclockwise direction from the inner circumferential end 22a toward the outer circumferential end 22b when viewed from the upper side.

The outer circumferential end 21b of the first spiral wiring 21 is connected to the first external terminal 41 through the first vertical wiring 51 (the via conductor 25 and the first columnar wiring 31) on the upper side of the outer circumferential end 21b. The inner circumferential end 21a of the first spiral wiring 21 is connected to the inner circumferential end 22a of the second spiral wiring 22 through the second via conductor 27 on the lower side of the inner circumferential end 21a.

The outer circumferential end 22b of the second spiral wiring 22 is connected to the second external terminal 42 through the second vertical wiring 52 (via conductors 25, 26 and the second columnar wiring 32) on the upper side of the outer circumferential end 22b. The outer circumferential end 22b of the second spiral wiring 22 is connected to the third external terminal 43 through the third vertical wiring 53 (the via conductor 25 and the third columnar wiring 33) on the lower side of the outer circumferential end 22b. The via conductor 26 extends in the Z direction from the via conductor 25 on the upper side of the outer circumferential end 22b of the second spiral wiring 22 to penetrate the inside of the insulating layer 15. The via conductor 26 is formed on the same plane as the first spiral wiring 21.

Similarly, the third spiral wiring 23 and the fourth spiral wiring 24 are connected in series through the second via conductor 27. The third spiral wiring 23 has the same configuration as the first spiral wiring 21, and the fourth spiral wiring 24 has the same configuration as the second spiral wiring 22.

Therefore, since the inductor component 1C has the first spiral wiring 21 and the second spiral wiring 22 connected in series by the second via conductor 27, the number of turns can be increased to improve the inductance value. Since the first to third vertical wirings 51 to 53 can be taken out from the outer circumferences of the first and second spiral wirings 21, 22, the inner diameters of the first and second spiral wirings 21, 22 can be made large to improve the inductance value. The third spiral wiring 23 and the fourth spiral wiring 24 are connected in series through the second via conductor 27 and therefore have the same effect.

Since the first spiral wiring 21 and the second spiral wiring 22 as well as the third spiral wiring 23 and the fourth spiral wiring 24 are both laminated in the normal direction, the inductor component 1C can be reduced in the area viewed in the Z direction, i.e., the mounting area, with respect to the number of turns so as to achieve the miniaturization of the inductor component 1C.

Although the inductor component 1C has a configuration including an even number of the series-connected spiral wirings, the present disclosure is not limited thereto and an odd number of series-connected spiral wirings may be included. The vertical wiring leads out a wiring from the spiral wiring in the Z direction and, therefore, even if an odd number of series-connected spiral wirings is included and one end portion of the inductor is disposed on the inner circumferential side, it is not necessary to lead out this end portion toward the outer circumference. Therefore, in this case, thinning can be achieved. Since a degree of freedom in the number of series-connected spiral wirings is improved in this way, a degree of freedom is also improved in the range of setting of the inductance value.

Although the inductor component 1C has two inductors made up of two layers of spiral wirings and arranged on the same plane, only one inductor may be arranged, or three or more inductors may be arranged, on the same plane.

Example

An example of the inductor component 1C will be described.

In this example, the inductor component has the chip size of 1010 (1.0 mm×1.0 mm), the thickness of 0.180 mm, the spiral wiring L/S/t=50/10/45 µm, the magnetic material thickness of 20 µm each on the upper and lower sides. Two layers of spiral wirings are electrically connected to form one inductor. The number of turns of one inductor is 4.5.

(Manufacturing Method)

A manufacturing method of the inductor component 1C will be described.

Figure 8A:
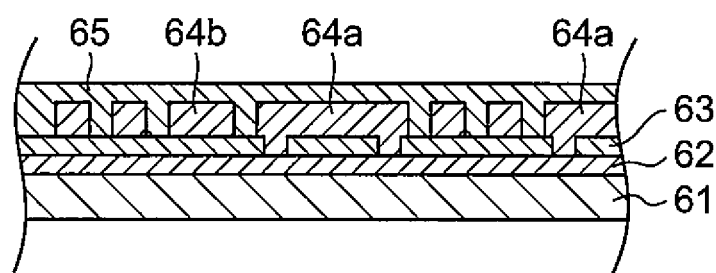
FIG. 8A is an explanatory view for explaining a manufacturing method of the inductor component according to the fourth embodiment.

First, the steps shown in FIGS. 4A to 4C of the manufacturing method of the inductor component 1 are executed. Subsequently, as shown in FIG. 8A, the first dummy copper 64a and the first spiral wiring 64b are covered with the first insulating layer 65. The insulating layer 65 is thermally press-bonded and thermally cured by a vacuum laminator, a press machine, etc.

Figure 8B:
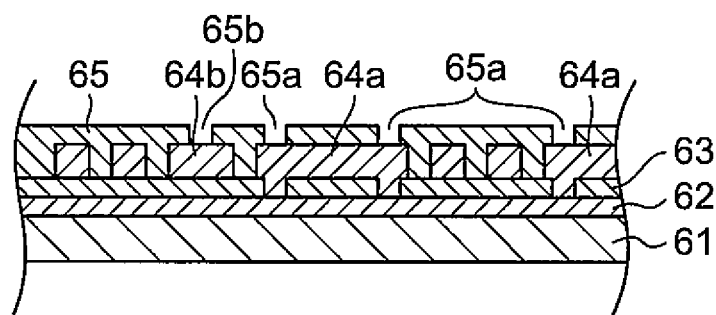
FIG. 8B is an explanatory view for explaining a manufacturing method of the inductor component according to the fourth embodiment.

As shown in FIG. 8B, the opening part 65a is formed by opening the insulating layer 65 on the dummy copper 64a, and an opening part 65b is formed by opening the insulating layer 65 on an end portion of the spiral wiring 64b, by laser processing etc.

Figure 8C:
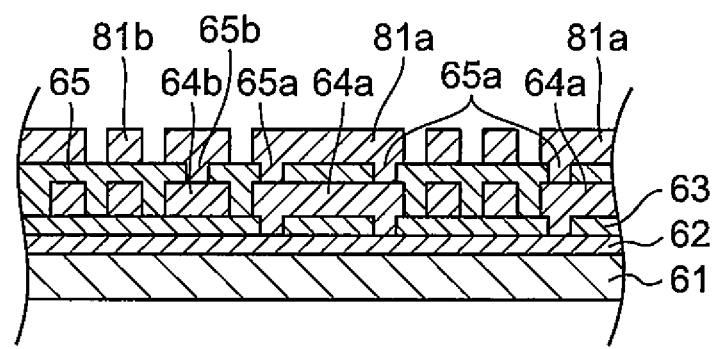
FIG. 8C is an explanatory view for explaining a manufacturing method of the inductor component according to the fourth embodiment.

As shown in FIG. 8C, SAP and a subsequent additional copper electrode plating are performed as is the case with FIG. 8C to form a second dummy copper 81a and a second spiral wiring 81b. If the number of laminated spiral wirings is increased, FIGS. 8A to 8C may be repeated.

Figure 8D:
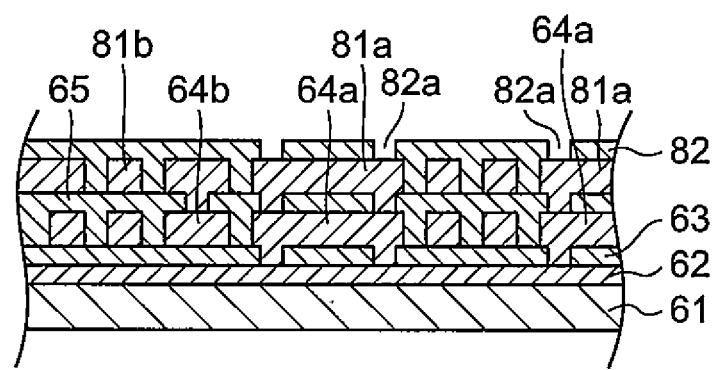
FIG. 8D is an explanatory view for explaining a manufacturing method of the inductor component according to the fourth embodiment.

As shown in FIG. 8D, the second dummy copper 81a and the second spiral wiring 81b are covered with a second insulating layer 82. The insulating layer 82 is thermally press-bonded and thermally cured by a vacuum laminator, a press machine, etc. An opening 82a of the insulating layer 82 on the second dummy copper 81a is formed by laser processing etc.

Figure 8E:
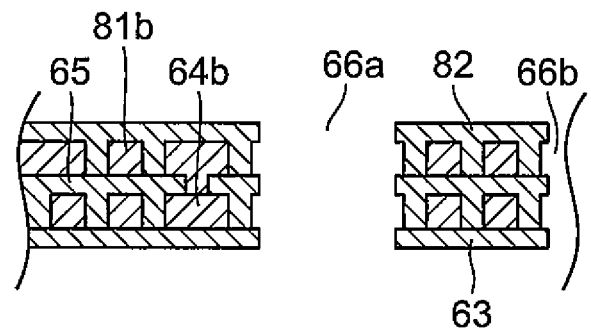
FIG. 8E is an explanatory view for explaining a manufacturing method of the inductor component according to the fourth embodiment.

Subsequently, the dummy core substrate 61 is peeled off from the copper foil 62. The copper foil 62 is removed by etching etc., and the dummy copper 64a is removed by etching etc., before forming the hole part 66a corresponding to the inner magnetic path part and the hole part 66b corresponding to the outer magnetic path part as shown in FIG. 8E.

Figure 8F:
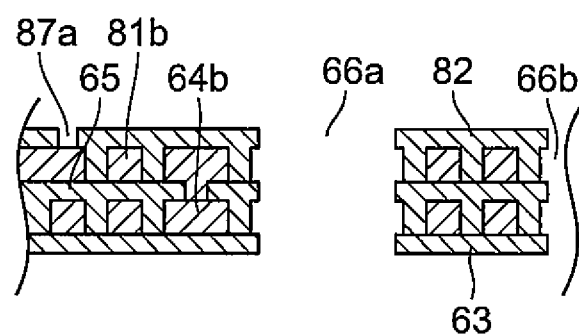
FIG. 8F is an explanatory view for explaining a manufacturing method of the inductor component according to the fourth embodiment.
Figure 8G:
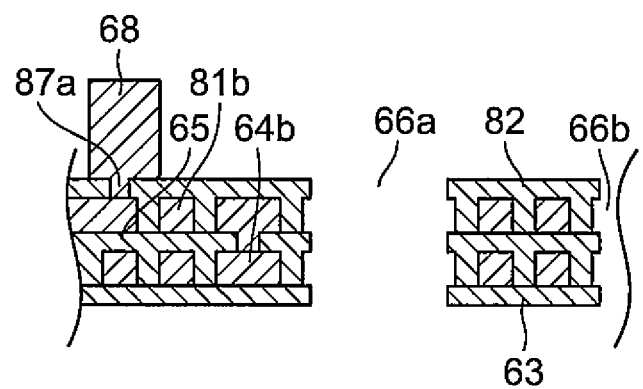
FIG. 8G is an explanatory view for explaining a manufacturing method of the inductor component according to the fourth embodiment.

Subsequently, as shown in FIG. 8F, an opening part 87a of the insulating layer 82 is formed by laser processing etc. As shown in FIG. 8G, the opening part 87a of the insulating layer 82 is then filled with copper by SAP and the columnar wiring 68 is formed on the insulating layer 82.

Figure 8H:
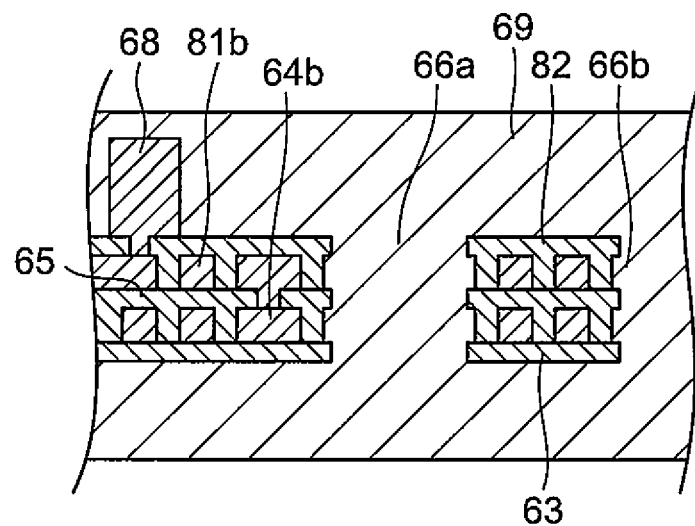
FIG. 8H is an explanatory view for explaining a manufacturing method of the inductor component according to the fourth embodiment.

As shown in FIG. 8H, the spiral wiring, the insulating layer, and the columnar wiring are covered with the magnetic material (magnetic layer) 69 to form an inductor substrate. The magnetic material 69 is thermally press-bonded and thermally cured by a vacuum laminator, a press machine, etc. At this time, the magnetic material 69 is also filled into the hole parts 66a, 66b.

Figure 8I:
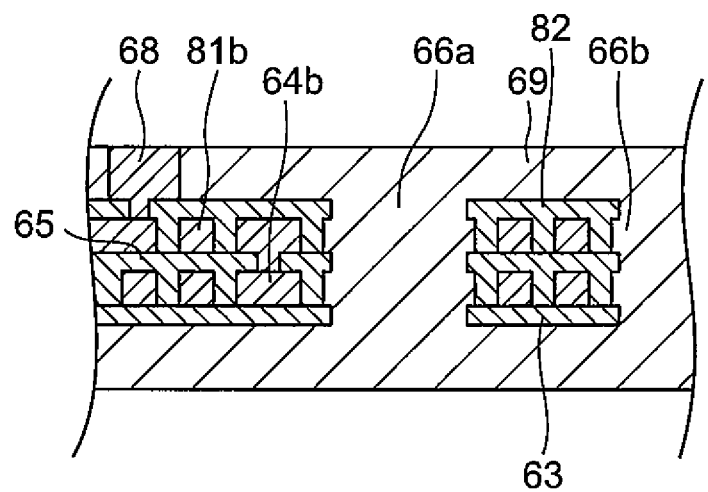
FIG. 8I is an explanatory view for explaining a manufacturing method of the inductor component according to the fourth embodiment.

As shown in FIG. 8I, the magnetic material 69 on the upper and lower sides of the inductor substrate is reduced in thickness by a grinding method. In this case, the columnar wiring 68 is partially exposed so that an exposed portion of the columnar wiring 68 is formed on the same plane as the magnetic material 69.

Figure 8J:
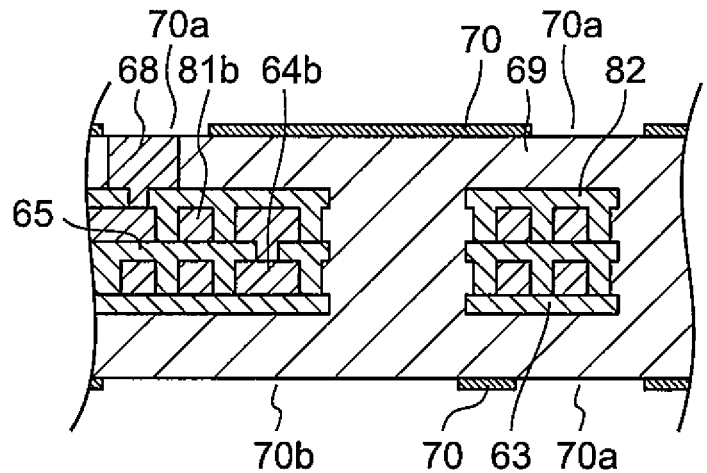
FIG. 8J is an explanatory view for explaining a manufacturing method of the inductor component according to the fourth embodiment.

Subsequently, as shown in FIG. 8J, the insulating resin (insulating layer) 70 is formed on a magnetic substance surface by a printing method. The opening part 70a of the insulating resin 70 is used as a portion for formation of an external terminal. Although the printing method is used in the above description, the opening part 70a may be formed by a photolithography method.

Figure 8K:
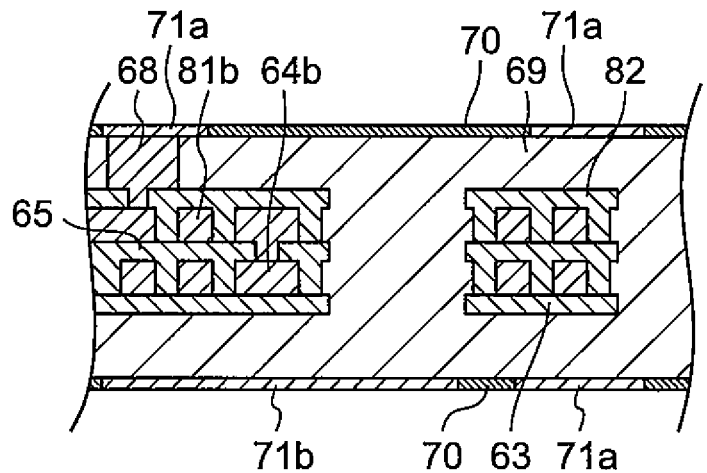
FIG. 8K is an explanatory view for explaining a manufacturing method of the inductor component according to the fourth embodiment.
Figure 8L:
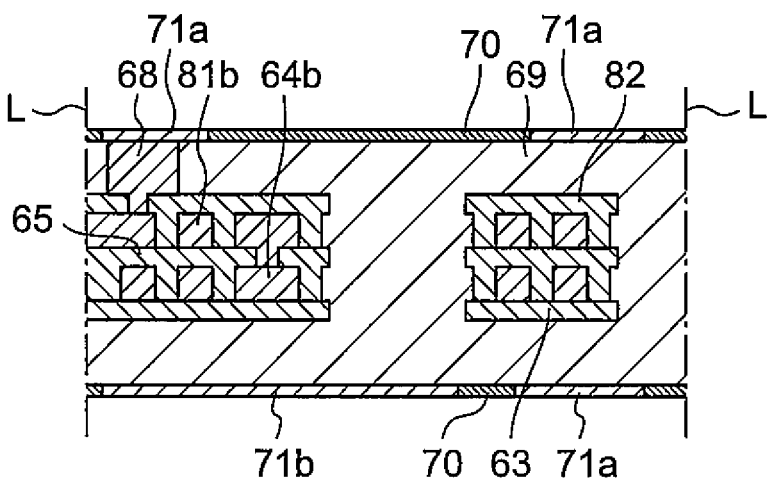
FIG. 8L is an explanatory view for explaining a manufacturing method of the inductor component according to the fourth embodiment.

As shown in FIG. 8K, an electroless copper plating or a plating film of Ni and Au etc. is applied to form the external terminal 71a and the dummy terminal 71b and, as shown in FIG. 8L, dicing is performed along broken line portions L to form individual pieces so as to acquire the inductor component 1C of FIG. 7B. The inductor substrates may be formed on both surfaces of the dummy core substrate 61. As a result, higher productivity can be achieved.

Fifth Embodiment (Configuration)

Figure 9A:
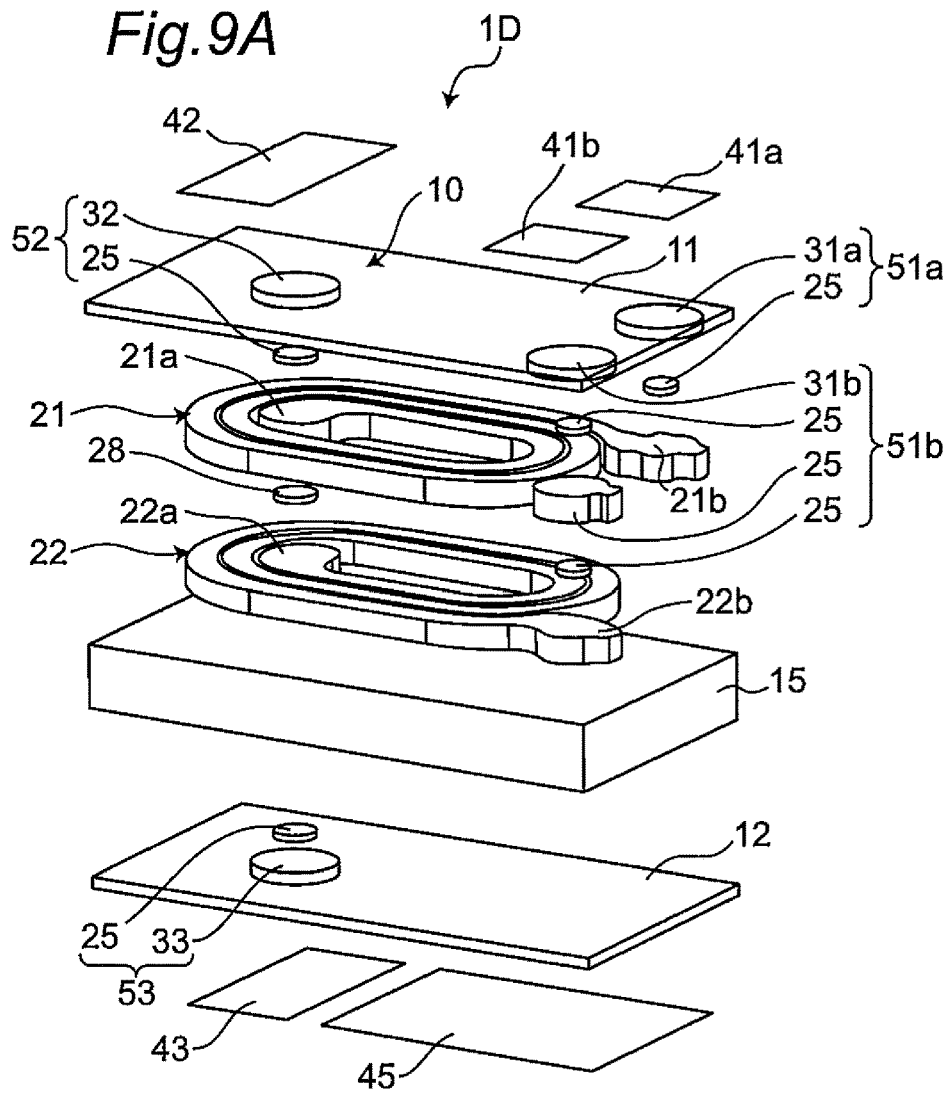
FIG. 9A is an exploded transparent perspective view of an inductor component according to a fifth embodiment.
Figure 9B:
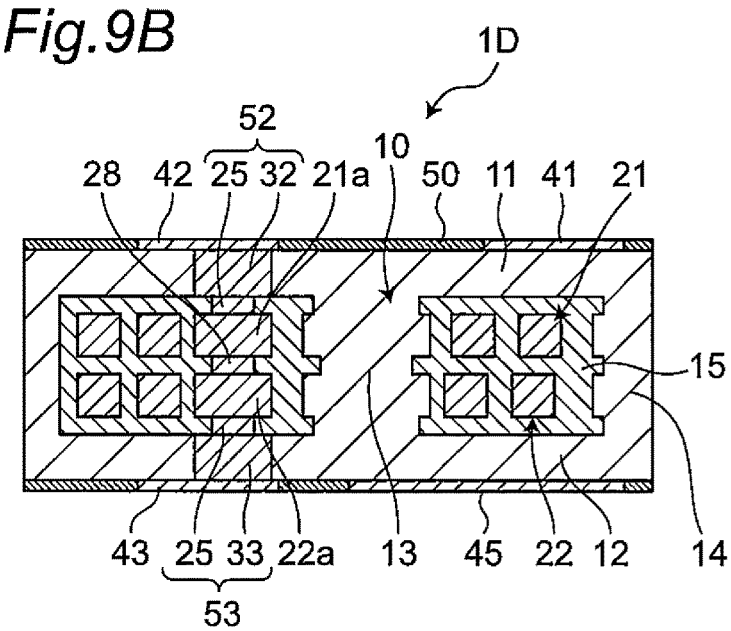
FIG. 9B is a cross-sectional view of the inductor component according to the fifth embodiment.

FIG. 9A is an exploded transparent perspective view of a fifth embodiment of an inductor component. FIG. 9B is a cross-sectional view of the inductor component. The fifth embodiment is different from the first embodiment in the configuration of the spiral wirings. This different configuration will hereinafter be described. In the fifth embodiment, the same constituent elements as the first embodiment are denoted by the same reference numerals as the other embodiments and therefore will not be described.

As shown in FIGS. 9A and 9B, as is the case with the inductor component 1, an inductor component 1D includes vertical wirings 51a, 51b, 52, 53 extending from the spiral wirings 21, 22 in the Z direction to penetrate the inside of the first magnetic layer 11 or the second magnetic layer 12. In FIG. 9A, the inner magnetic path part 13 and the outer magnetic path part 14 of FIG. 9B are not shown.

On the other hand, the inductor component 1D has the first spiral wiring 21 and the second spiral wiring 22 electrically connected to the common vertical wirings 52, 53. The first spiral wiring 21 and the second spiral wiring 22 are laminated in the Z direction. The first spiral wiring 21 is spirally wound in a counterclockwise direction from the outer circumferential end 21b toward the inner circumferential end 21a when viewed from the upper side. The second spiral wiring 22 is spirally wound in a counterclockwise direction from the inner circumferential end 22a toward the outer circumferential end 22b when viewed from the upper side.

With regard to "electrically connected" in the above description, for example, in FIGS. 9A and 9B, the second spiral wiring 22 is not in direct contact with the vertical wiring 52 and is connected to the vertical wiring 52 through a third via conductor 28 and the inner circumferential end 21a of the first spiral wiring 21. On the other hand, when viewed as an electric circuit diagram, the third via conductor 28 and the inner circumferential end 21a between the second spiral wiring 22 and the vertical wiring 52 do not correspond to circuit elements and are categorized merely as wirings and the like, and it can be said that the second spiral wiring 22 and the vertical wiring 52 are "connected". This relationship is also applied to the first spiral wiring 21 and the vertical wiring 53. As described above, "electrically connected" includes a form of connection through members considered merely as wirings and the like not equivalent to circuit elements.

The first vertical wiring 51a (the via conductor 25 and a first columnar wiring 31a) extends from the outer circumferential end 21b of the first spiral wiring 21 upward in the Z direction to penetrate the inside of the first magnetic layer 11 on the upper side, and is connected to a first external terminal 41a. The first vertical wiring 51b (the via conductor 25 and a first columnar wiring 31b) extends from the outer circumferential end 22b of the second spiral wiring 22 upward in the Z direction to penetrate the inside of the upper first magnetic layer 11 on the upper side and is connected to a first external terminal 41b.

The second vertical wiring 52 (the via conductor 25 and the second columnar wiring 32) extends from the inner circumferential end 21a of the first spiral wiring 21 upward in the Z direction to penetrate the inside of the first magnetic layer 11 on the upper side and is connected to the second external terminal 42. The third vertical wiring 53 (the via conductor 25 and the third columnar wiring 33) extends from the inner circumferential end 22a of the second spiral wiring 22 downward in the Z direction to penetrate the inside of the second magnetic layer 12 on the lower side and is connected to the third external terminal 43. The inductor component 1D has the first spiral wiring 21 and the second spiral wiring 22 connected to each other through the third via conductor 28 at the inner circumferential ends 21a, 22a. In other words, the first spiral wiring 21 and the second spiral wiring 22 are electrically connected to the common second vertical wiring 52 and are electrically connected to the common third vertical wiring 53.

Therefore, for example, by using the side of the common vertical wirings 52, 53 as the common output of the first and second spiral wirings 21, 22, it is not necessary to branch the substrate wiring on the substrate side of mounting, and an amount of routing of the substrate wiring can be reduced. The common columnar wirings 32, 33 are not limited to the output side and may be on the input side and, from this point, the degree of freedom in circuit design can be improved.

Since the first spiral wiring 21 and the second spiral wiring 22 are laminated in the normal direction, the inductor component 1D can be reduced in the area viewed in the Z direction, i.e., the mounting area, with respect to the number of turns so as to achieve the miniaturization of the inductor component 1D. In this case, since the inner magnetic path parts 13 of the first spiral wirings 21, 22 come extremely close, the first spiral wiring 21 and the second spiral wiring 22 can strongly magnetically be coupled to each other.

Although the inductor component 1D has the two laminated inductors (spiral wirings), three or more inductors may be laminated. Additionally, as is the case with the inductor component 1C, a plurality of inductors may be arranged on the same plane.

Example

An example of the inductor component 1D will be described.

In this example, the inductor component has the chip size of 1005 (1.0 mm×0.5 mm), the thickness of 0.180 mm, the spiral wiring L/S/t=50/10/45 μm, and the magnetic layer thickness of 20 μm each on the upper and lower sides.

Sixth Embodiment (Configuration)

Figure 10:
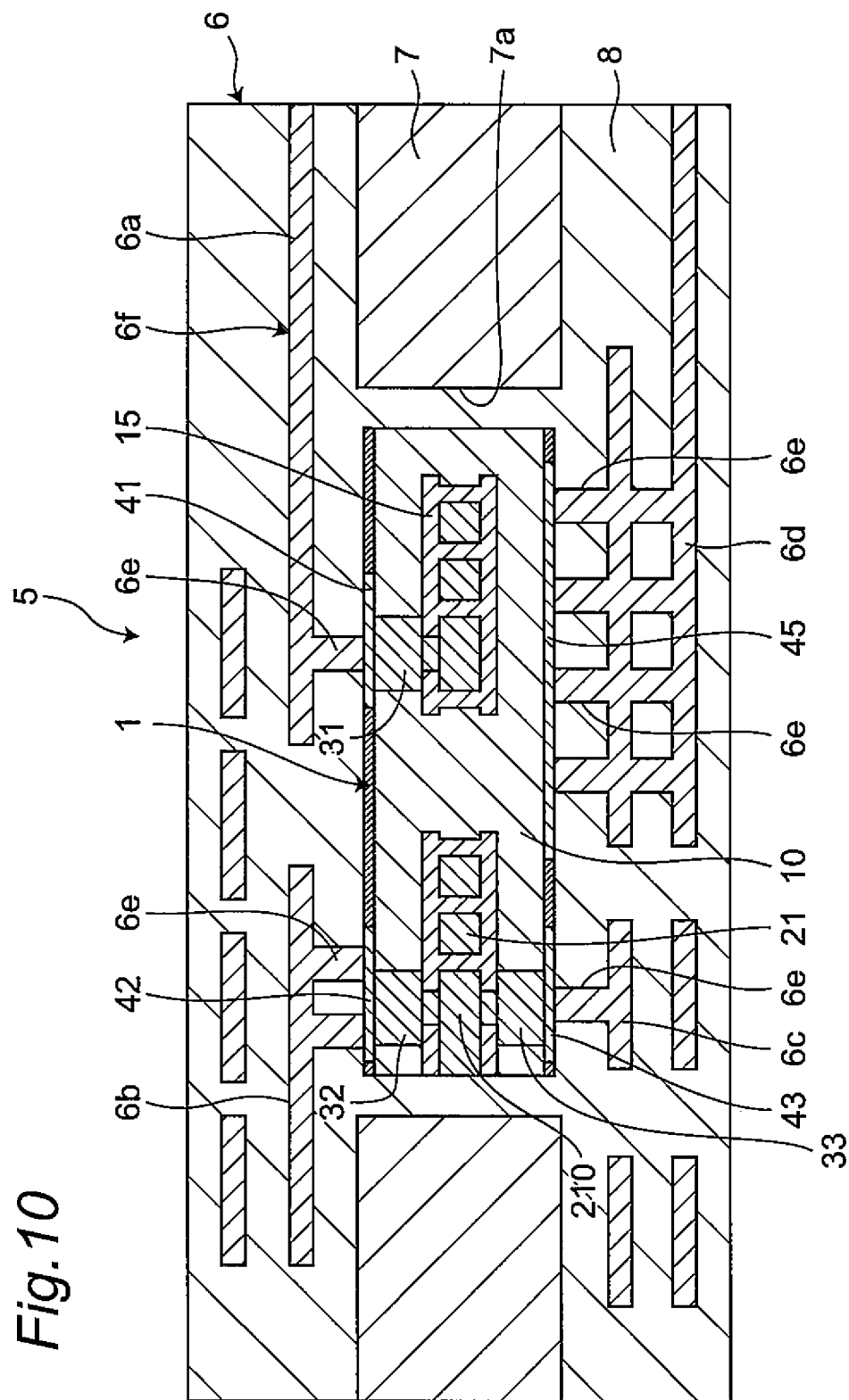
FIG. 10 is a cross-sectional view of an embodiment of an inductor-component incorporating substrate.

FIG. 10 is a cross-sectional view of an embodiment of an inductor-component incorporating substrate. In this embodiment, the same constituent elements as the first embodiment are denoted by the same reference numerals as the first embodiment and therefore will not be described.

As shown in FIG. 10, an inductor-component incorporating substrate 5 includes the inductor component 1 of the first embodiment, a substrate 6 in which the inductor component 1 is embedded, and a substrate wiring 6f including pattern parts 6a to 6d extending in a direction along a principal surface of the substrate 6 and via parts 6e extending in the thickness direction of the substrate 6. The substrate 6 includes a core material 7 and an insulating layer 8. The inductor component 1 is disposed in a through-hole 7a of the core material 7 and is covered with the insulating layer 8 together with the core material 7. The inductor component 1 is embedded in the substrate 6 such that the principal surface of the substrate 6 becomes substantially parallel to the principal surface of the magnetic layer 10 and the plane of the wound spiral wirings 21, 22. Therefore, the Z direction (the normal direction to the plane of the wound spiral wirings 21, 22) of the inductor component 1 is substantially coincident with the thickness direction of the substrate 6 and is substantially orthogonal to the principal surface of the substrate 6.

The substrate wiring 6f is connected at the via parts 6e to the external terminals 41 to 43 of the inductor component 1. The via parts 6e include first via parts connected to the inductor component 1 from the upper side in the Z direction and second via parts connected to the inductor component 1 from the lower side in the Z direction. Specifically, the first external terminal 41 is connected to the first pattern part 6a through the via part 6e (first via part) on the upper side of the first external terminal 41. The second external terminal 42 is connected to the second pattern part 6b through the via part 6e (first via part) on the upper side of the second external terminal 42. The third external terminal 43 is connected to the third pattern part 6c through the via part 6e (second via part) on the lower side of the third external terminal 43. The dummy terminal 45 is connected to the fourth pattern part 6d through the via part 6e (second via part) on the lower side of the dummy terminal 45.

Therefore, the inductor-component incorporating substrate 5 has the spiral wirings 21, 22 of the inductor component 1 and the substrate wiring 6f connected by the vertical wirings 51 to 53 and the via parts 6e extending in the Z direction. This means that the spiral wirings 21, 22 and the substrate wiring 6f are connected without excess wiring routing. The inductor-component incorporating substrate 5 has an effectively usable space made available because of this elimination of the excess wiring routing and therefore can improve the degree of freedom in circuit design as compared to the inductor components and the inductor-component incorporating substrates of conventional techniques.

Additionally, the inductor-component incorporating substrate 5 can reduce the wiring resistance because of the absence of the excess wiring routing. Furthermore, the inductor-component incorporating substrate 5 enables reduction in size and thickness of a whole circuit by embedding the relatively large inductor component 1 in the substrate 6.

Additionally, the via parts 6e include the first via parts and the second via parts, and the substrate wiring 6f is connected from both (upper and lower) sides in the Z direction of the inductor part 1. In this case, as compared to the conventional inductor-component incorporating substrates having a substrate wiring connected from only one side of the inductor component, layout options of the pattern parts 6a to 6d increase, and the degree of freedom in circuit design is improved.

Figure 11:
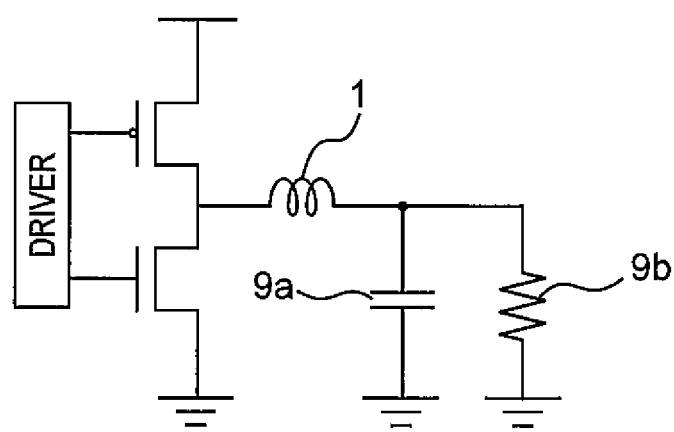
FIG. 11 is a simplified configuration diagram of an LC ripple filter.

For example, assuming that the inductor component 1 is used as a portion of an LC ripple filter of a DC-DC converter circuit as shown in FIG. 11, the output side of the inductor component 1 requires two routes as a route connecting to a smoothing capacitor 9a and a route connecting to a load 9b.

Therefore, for example, as shown in FIG. 10, the second pattern part 6b connected to the second external terminal 42 on the upper side can electrically be connected to the load 9b and the third pattern part 6c connected to the third external terminal 43 on the lower side can be connected to the smoothing capacitor 9a so as to reduce an amount of wiring routing, and a small-sized DC-DC converter circuit can easily be configured.

Additionally, by connecting the dummy terminal 45 to the pattern part 6d of the substrate wiring 6f, the dummy terminal 45 and the substrate wiring 6f can be ensured as a heat dissipation path of the inductor component 1. Particularly, since the substrate wiring 6f is made of copper and has a very high thermal conductivity, the heat generated from the inductor component 1 is efficiently dissipated from the dummy terminal 45 through the substrate wiring 6f, so that the heat dissipation can be improved. When the pattern part 6d of the substrate wiring 6f is a ground line, the dummy terminal 45 can be allowed to function as an electrostatic shield.

As described in the first embodiment, the inductor component 1 has the area of the external terminals 41 to 43 larger than the area of the columnar wirings 31 to 33 when viewed in the Z direction and, therefore, the area of the external terminals 41 to 43 can be made larger. Thus, when the substrate 6 is provided with the via parts 6e to be connected to the external terminals 41 to 43 of the inductor component 1 when the inductor component 1 is embedded in the substrate 6, large margins can be ensured for positions of formation of the via parts 6e with respect to the external terminals 41 to 43, so that a yield can be improved at the time of embedding.

In FIG. 10, only the inductor component 1 and the substrate wiring 6f are shown in the inductor-component incorporating substrate 5; however, the inductor-component incorporating substrate 5 may have other embedded electronic components such as a semiconductor component, a capacitor component, and a resistance component. Another electronic component may also be surface-mounted on, or a semiconductor chip may be bonded to, the principal surface of the substrate 6.

Example

An example of the inductor-component incorporating substrate 5 will be described.

In this example, the external terminals 41 to 43 and the dummy terminals 45 are formed by electroless copper plating, and the thickness of the copper plating is 5 μm.

The thickness of the copper plating of the external terminals 41 to 43 and the dummy terminals 45 is preferably 2 μm or more and 20 μm or less. If the thickness of the copper plating is 2 μm or more, all the terminals can be covered with copper plating. By setting the thickness of the copper plating to 20 μm or less, the inductor component 1 can be thinned and, as a result, the substrate 6 having the inductor component 1 embedded therein can be reduced in thickness.

The substrate wiring 6f of this example is a copper wiring formed by a subtractive method.

(Manufacturing Method)

A manufacturing method of the inductor-component incorporating substrate 5 will be described.

Figure 12A:
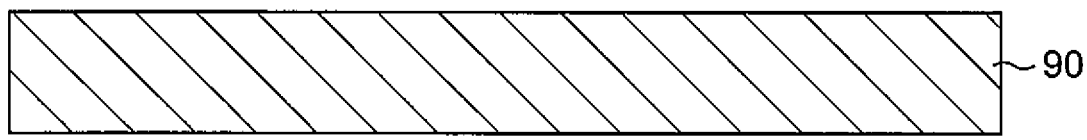
FIG. 12A is an explanatory view for explaining a manufacturing method of an inductor-component incorporating substrate according to an embodiment.

As shown in FIG. 12A, a core material 90 is prepared. A thin material of 0.33 mm, 0.18 mm, etc. is used for the core material 90 so as to reduce the size and thickness of the substrate 6, for example.

Figure 12B:
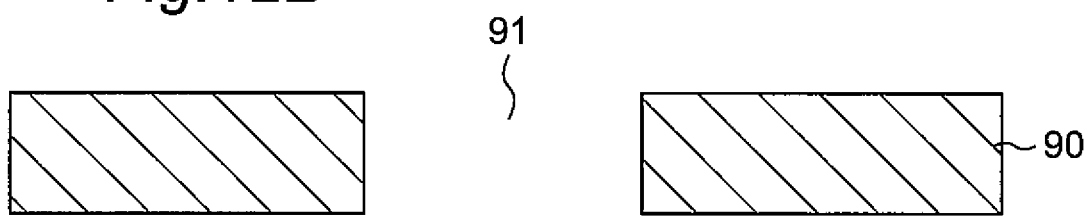
FIG. 12B is an explanatory view for explaining a manufacturing method of the inductor-component incorporating substrate according to the embodiment.

As shown in FIG. 12B, a cavity 91 is formed in the core material 90 by a drill, a laser, etc.

Figure 12C:
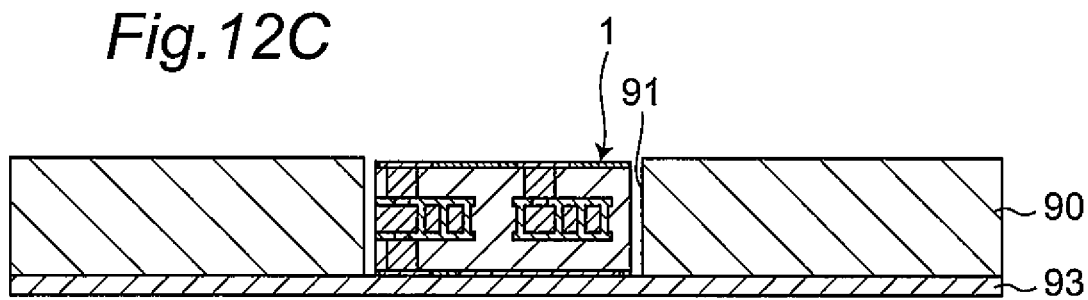
FIG. 12C is an explanatory view for explaining a manufacturing method of the inductor-component incorporating substrate according to the embodiment.

As shown in FIG. 12C, a temporary sticking tape 93 with low tackiness is affixed to the lower surface of the core material 90. It is noted that a heat foaming sheet etc. may be used instead of the temporary sticking tape 93. The inductor component 1 is then disposed in the cavity 91.

Figure 12D:
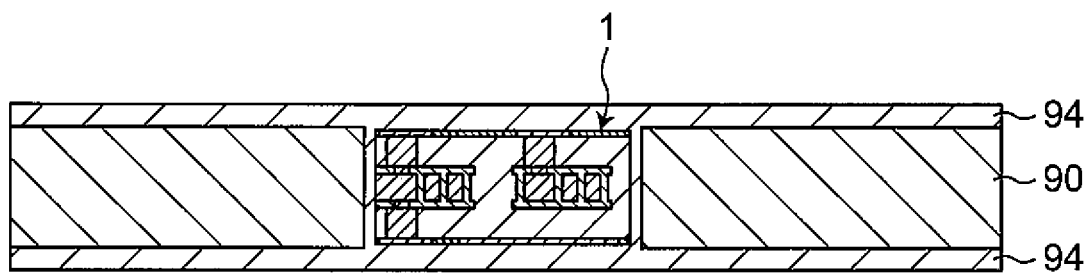
FIG. 12D is an explanatory view for explaining a manufacturing method of the inductor-component incorporating substrate according to the embodiment.

As shown in FIG. 12D, an insulating layer 94 such as a buildup sheet or prepreg is laminated on the upper surface of the core material 90 to seal the inductor component 1 and the core material 90, and the temporary sticking tape 93 is removed. The lower surface side of the core material 90 is laminated with the insulating layer 94 and thermally cured.

Figure 12E:
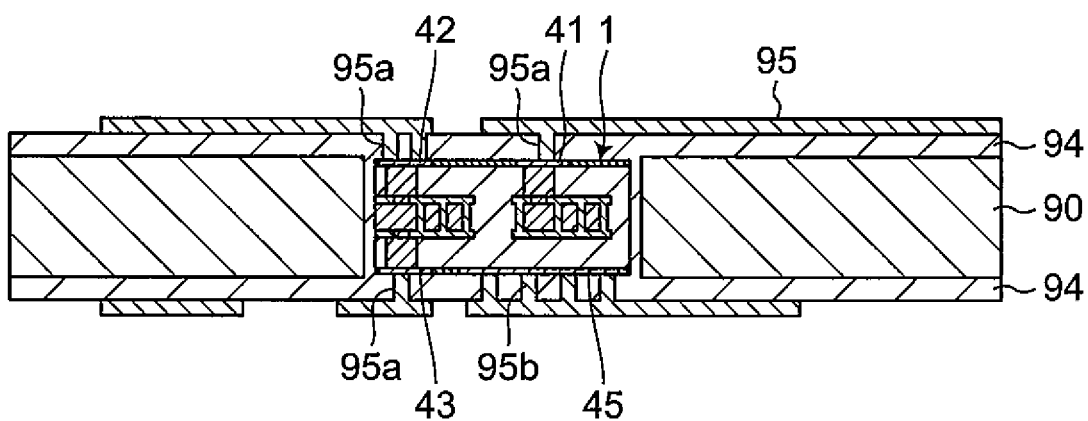
FIG. 12E is an explanatory view for explaining a manufacturing method of the inductor-component incorporating substrate according to the embodiment.

As shown in FIG. 12E, via holes are formed by laser processing etc. in portions of the insulating layer 94 serving as contact points of a circuit to the external terminals and the dummy terminals of the inductor component 1. In this case, preferably, the external terminals are sufficiently larger than the alignment accuracy of the laser. Since the area of the external terminals and the area of the columnar wirings can independently be set in the inductor component 1 when viewed in the Z direction, the external terminals can easily be made larger than the alignment accuracy of the laser, so that laser processing defects can be suppressed to improve productivity.

Subsequently, the smear of the laser is removed, and a circuit wiring layer 95, a via conductor 95a electrically connected to a spiral wiring, and a via conductor 95b not electrically connected to a spiral wiring are formed by a method such as electroless plating and electrolytic plating. In this example, a subtractive method was used.

By repeating the step of FIG. 12E, a multilayer circuit wiring layer shown in FIG. 10 can be acquired.

The present disclosure is not limited to the embodiments described above and may be changed in design without departing from the spirit of the present disclosure. For example, respective feature points of the first to sixth embodiments may variously be combined.

Even if the first to sixth embodiments includes an embodiment in which an effect described in another embodiment is not particularly mentioned and is not described, basically the same effect is produced by the embodiment as well, given that the embodiment has the same configuration.

The invention claimed is:

1. An inductor component comprising:
   a spiral wiring wound into a single layer planar shape;
   a first magnetic layer and a second magnetic layer located at positions sandwiching the spiral wiring from both sides in a first normal direction relative to a top plane of the wound spiral wiring and in a second normal direction relative to a bottom plane of the wound spiral wiring, respectively; and
   a first vertical wiring extending from the spiral wiring in the first normal direction to penetrate inside of the first magnetic layer, and a second vertical wiring extending from the spiral wiring in the second normal direction to penetrate inside of the second magnetic layer, wherein
   the first vertical wiring and the second vertical wiring are located on respective sides of the both sides in the first and second normal directions sandwiching the spiral wiring,
   the first vertical wiring on the side of the first magnetic layer and the second vertical wiring on the side of the second magnetic layer are directly connected to the spiral wiring at a common connecting portion, and
   the first and second vertical wirings have the same shape.

2. The inductor component according to claim 1, further comprising
   a conductive dummy terminal disposed on a surface of the first magnetic layer or the second magnetic layer without being electrically connected to the spiral wiring.

3. The inductor component according to claim 1, wherein
   the first vertical wiring or the second vertical wiring includes an end surface exposed from a surface of the first magnetic layer or the second magnetic layer, respectively, that is not subjected to a rust prevention treatment.

4. The inductor component according to claim 1, further comprising
   an external terminal covering an end surface of the first vertical wiring or the second vertical wiring that is exposed from a surface of the first magnetic layer or the second magnetic layer, respectively, wherein
   when viewed in the first normal direction, an area of the external terminal is larger than an area of the vertical wiring.

5. The inductor component according to claim 4, wherein
   a surface of the external terminal is located on an outer side in the first normal direction than the surface of the first magnetic layer or the second magnetic layer.

6. The inductor component according to claim 4, wherein
   the external terminal is located on each of both sides in the normal direction sandwiching the spiral wiring.

7. The inductor component according to claim 1, further comprising
   a coating film covering the surface of the first magnetic layer or the second magnetic layer and exposing at least a portion of an end surface of the first vertical wiring or the second vertical wiring.

8. The inductor component according to claim 7, wherein
   the end surface of the first vertical wiring or the second vertical wiring that is exposed from the coating film is at a position displaced with respect to a contact surface between the vertical wiring and the spiral wiring when viewed in the first normal direction.

9. The inductor component according to claim 1, wherein
   a thickness of the first magnetic layer is different from a thickness of the second magnetic layer.

10. The inductor component according to claim 9, wherein
    the first vertical wiring or the second vertical wiring penetrates the inside of a thicker one between the first magnetic layer and the second magnetic layer.

11. The inductor component according to claim 9, further comprising
    a dummy terminal disposed on a surface of the first magnetic layer or the second magnetic layer without being electrically connected to the spiral wiring, wherein
    the dummy terminal is disposed on the surface of a thinner one between the first magnetic layer and the second magnetic layer.

12. The inductor component according to claim 1, wherein
    the spiral wiring is one of a plurality of spiral wirings, and wherein the inductor component further comprises a second via conductor connecting the plurality of spiral wirings in series.

13. The inductor component according to claim 1, further comprising
    a third vertical wiring that extends from the spiral wiring in the first normal direction to penetrate inside of the first magnetic layer, the third vertical wiring being connected to the spiral wiring at an interior position of the spiral winding.

14. An inductor component comprising:
    a spiral wiring wound into a single layer planar shape;
    a first magnetic layer and a second magnetic layer located at positions sandwiching the spiral wiring from both sides in a first normal direction relative to a top plane of the wound spiral wiring and in a second normal direction relative to a bottom plane of the wound spiral wiring, respectively; and
    a first vertical wiring extending from the spiral wiring in the first normal direction to penetrate inside of the first magnetic layer, and a second vertical wiring extending from the spiral wiring in the second normal direction to penetrate inside of the second magnetic layer, wherein
    the first vertical wiring and the second vertical wiring are located on respective sides of the both sides in the first and second normal directions sandwiching the spiral wiring,
    the first vertical wiring on the side of the first magnetic layer and the second vertical wiring on the side of the second magnetic layer are connected to a common connecting portion of the spiral wiring, and
    the first and second vertical wirings have the same shape, wherein
    the spiral wiring is a first spiral wiring,
    the inductor component further includes a second spiral wiring wound into a single layer planar shape, and
    the first spiral wiring and the second spiral wiring are electrically connected to a common vertical wiring.

15. The inductor component according to claim 14, wherein
    the first spiral wiring and the second spiral wiring are laminated in the normal direction.

16. An inductor-component incorporating substrate comprising:
an inductor component including:
a single layer spiral wiring wound into a planar shape;
a first magnetic layer and a second magnetic layer located at positions sandwiching the spiral wiring from both sides in a first normal direction relative to a top plane of the wound spiral wiring and in a second normal direction relative to a bottom plane of the wound spiral wiring, respectively; and
a first vertical wiring extending from the spiral wiring in the first normal direction to penetrate inside of the first magnetic layer, and a second vertical wiring extending from the spiral wiring in the second normal direction to penetrate inside of the second magnetic layer, wherein
the first vertical wiring and the second vertical wiring are located on respective sides of the both sides in the first and second normal directions sandwiching the spiral wiring,
the first vertical wiring on the side of the first magnetic layer and the second vertical wiring on the side of the second magnetic layer are connected to a common connecting portion of the spiral wiring, and
the first and second vertical wirings have the same shape; and
a substrate in which the inductor component is embedded; and
a substrate wiring including a pattern part extending in a direction along a principal surface of the substrate and a via part extending in a thickness direction of the substrate, wherein
the substrate wiring being connected at the via part to the inductor component.

17. The inductor-component incorporating substrate according to claim 16, wherein
the via part includes a first via part connected to the inductor component from one side in the normal direction and a second via part connected to the inductor component from the other side in the normal direction.

18. The inductor-component incorporating substrate according to claim 17, wherein
the spiral wiring includes a connecting portion connected to the first vertical wiring or the second vertical wiring, respectively, and
the first via part and the second via part are electrically connected to a common connecting portion of the spiral wiring.

19. The inductor-component incorporating substrate according to claim 16, wherein
the inductor component has a dummy terminal disposed on a surface of the first magnetic layer or the second magnetic layer without being electrically connected to the spiral wiring, and wherein
a dummy terminal is connected to the substrate wiring.

20. The inductor-component incorporating substrate according to claim 19, wherein
the dummy terminal is connected to a ground line of the substrate wiring.

* * * * *